(12) United States Patent
Yamashita et al.

(10) Patent No.: US 7,899,637 B2
(45) Date of Patent: *Mar. 1, 2011

(54) METHOD AND APPARATUS FOR CREATING A GATE OPTIMIZATION EVALUATION LIBRARY

(75) Inventors: Asao Yamashita, Fishkill, NY (US); Merritt Funk, Austin, TX (US); Daniel Prager, Hopewell Junction, NY (US); Lee Chen, Cedar Creek, TX (US); Radha Sundararajan, Dripping Springs, TX (US)

(73) Assignee: Tokyo Electron Limited, Tokyo (JP)

( * ) Notice: Subject to any disclaimer, the term of this patent is extended or adjusted under 35 U.S.C. 154(b) by 886 days.

This patent is subject to a terminal disclaimer.

(21) Appl. No.: 11/762,563

(22) Filed: Jun. 13, 2007

(65) Prior Publication Data

US 2008/0311688 A1 Dec. 18, 2008

(51) Int. Cl.
*B21D 22/00* (2006.01)

(52) U.S. Cl. .............................. 702/85; 356/72; 356/311

(58) Field of Classification Search ........................ None
See application file for complete search history.

(56) References Cited

U.S. PATENT DOCUMENTS

| | | | |
|---|---|---|---|
| 6,046,796 A * | 4/2000 | Markle et al. | .................. 356/72 |
| 6,542,920 B1 | 4/2003 | Belkin et al. | |
| 6,815,345 B2 | 11/2004 | Zhao et al. | |
| 7,005,330 B2 | 2/2006 | Yeo et al. | |
| 7,007,206 B2 | 2/2006 | Anonson | |
| 7,405,032 B1 * | 7/2008 | Amblard et al. | ............. 430/311 |
| 7,514,277 B2 * | 4/2009 | Saito et al. | .................... 438/16 |
| 2004/0185583 A1 | 9/2004 | Tomoyasu et al. | |
| 2004/0267399 A1 | 12/2004 | Funk | |
| 2006/0015206 A1 | 1/2006 | Funk et al. | |
| 2007/0119545 A1 | 5/2007 | Del Puppo et al. | |

OTHER PUBLICATIONS

K. Bernstein, et al; High-Performance CMOS Variability in the 65-nm Regime and Beyond; IBM Journal of R&D; Aug. 2006.
U.S. Appl. No. 11/762,258, Yamashita et al; "Method and Apparatus for Optimizing a Gate Channel".

* cited by examiner

*Primary Examiner*—Duy-Vu N Deo

(57) ABSTRACT

The invention can provide a method of processing a substrate using Gate-Optimization processing sequences and evaluation libraries that can include gate-etch procedures, COR-etch procedures, and evaluation procedures.

15 Claims, 18 Drawing Sheets

METHOD AND APPARATUS FOR CREATING A GATE OPTIMIZATION EVALUATION LIBRARY

CROSS-REFERENCE TO RELATED-APPLICATIONS

This application is related to co-pending, entitled "Method and Apparatus for Optimizing a Gate Channel", filed herewith and the contents of this application is herein incorporated by reference in its entirety.

BACKGROUND OF THE INVENTION

1. Field of the Invention

The present invention relates to substrate processing, and more particularly to improving the substrate processing using optimized gate channel procedures and subsystems.

2. Description of the Related Art

Current low cost products use a bulk silicon technology. As the transistor continues to shrink, the impact of the channel depth is becoming critical (ultra-shallow source/drain extensions). As the silicon-on-insulator (SOI) firm shrinks, a small variation in the gate oxide swelling becomes a larger percent of the SOI firm thickness. The resultant increase in the variation of thickness of the SOI film both at the edge of the gate and over the contact areas affects the conductive properties of the contact of the source and drain. When gate-etch procedures are not controlled, the removal of the exposed gate oxide near the gate affects the electric field between the source and drain.

Current high performance microprocessors from device manufacturers, such as International Business Machines (IBM) and Advanced Micro Devices (AMD) use PD SOI (partially depleted film having a threshold voltage 0.2 volts and C of 0.7), PD SOI films are around 50 nm while the oxide swelling can be 5 nm (or 10% of the thickness).

Future generations of SOS films are called FD SOI (fully depleted firm having a threshold voltage 0.08 volts and a thickness of ~25 nm). Currently these films are not in production due to limitations in thickness control uniformity and defects. Channel mobility degrades with decreasing SOI thickness. Using the current procedures would allow the gate oxide swelling to continue, and the current results can be as large as 20% of the SOI thickness.

With thinner SOI film, the impact of the spacer sidewall thickness also becomes a critical knob to control due to its impact on the implant profile.

SUMMARY OF THE INVENTION

The invention ran provide apparatus and methods of processing a substrate in real-time using gate optimization procedures and evaluation libraries to minimize or eliminate oxide damage.

Other aspects of the invention will be made apparent from the description that follows and from the drawings appended hereto.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

The present invention provides apparatus and methods for processing substrates having a large number of semiconductor devices thereon and an even larger number of transistor gate and/or spacer structures. In various embodiments, apparatus and methods are provided for creating, and/or using a gate-optimization evaluation library, for performing processing sequences that can include one or more gate-etch procedures and one or more chemical oxide removal (COR)-etch procedures, and/or for verifying gate-optimization procedures.

One or more evaluation features can be provided at various locations on a substrate and can be used to evaluate and/or verify gate optimization procedures. Substrates can have substrate data associated with them, and the substrate data can include real-time and historical data. In addition, the substrate can have other data associated with them, and the other data can include gate structure data, the number of required sites, the number of visited sites, confidence data and/or risk data for one or more of the sites, site ranking data, transferring sequence data, or process-related data or evaluation/verification-related data, or any combination thereof. The data associated with gate optimization substrate can include transfer sequence data that can be used to establish when and where to transfer gate optimization substrates. Processing sequences can also be established for each gate optimization substrate.

In some examples, gate optimization processing sequences can include a gate-etch procedures a COR-etch procedure, and a transfer sequence. For example, transfer sequences can be established based on the number of substrates that require gate-etch processing, the number of substrates that require COR-etch processing, the number of available processing elements, the number of substrates that require evaluation, the number of available evaluation elements, the loading data for one or more transfer subsystems.

As feature sizes decrease below the 65 nm node, accurate processing and/or measurement data becomes more important and more difficult to obtain. Gate-optimization procedures can be used to more accurately process and/or measure these ultra-small devices and features. The data from a gate-optimization procedure can be compared with the warning and/or control limits, when a run-rule is violated, an alarm can be generated indicating a processing problem, and real-time correction procedures can be performed.

Figure 1:
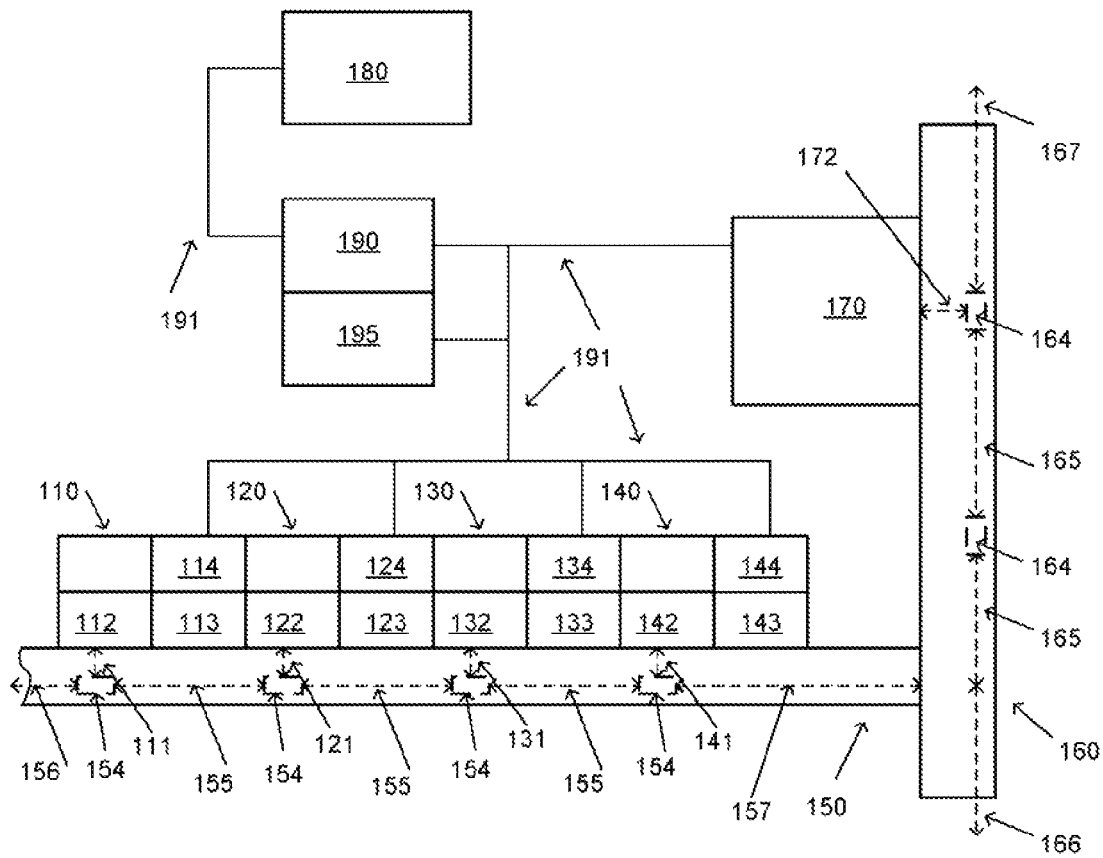
FIG. 1 shows an exemplary block diagram of a processing system in accordance with embodiments of the invention.

FIG. 1 shows an exemplary block diagram of a processing system in accordance with embodiments of the invention. In the illustrated embodiment, processing system 100 comprises all etching subsystem 110, a Chemical Oxide Removal (COR) subsystem 120, a deposition subsystem 130, an evaluation subsystem 140, a first transfer subsystem 150, a second transfer subsystem 160, a lithography subsystem 170, a manufacturing execution system (MES) 180, a system controller 190 and a memory/database 195. Single subsystems (110, 120, 130, 140, 150, 160, and 170) are shown in the illustrated embodiment, but this is not required for the invention. In some embodiments, multiple subsystems (110, 120, 130, 140, 150, 160, and 170) can be used in a processing system 100. In addition, one or more of the subsystems (110, 120, 130, 140, 150, 160, and 170) can comprise one or more processing elements that can be used to perform one or more processes.

The system controller 190 can be coupled to the etching subsystem 110, the COR subsystem 120, the deposition subsystem 130, the evaluation subsystem 140, the first transfer subsystem 150, the second transfer subsystem 160, and the lithography subsystem 170 using a data transfer subsystem 191. The system controller 190 can be coupled to the MES 180 using the data transfer subsystem 191. Alternatively, other configurations may be used.

The etching subsystem 110 can be coupled to the first transfer subsystem 150 and one or more substrates (not shown) can be transferred 111 between the etching subsystem 110 and the first transfer subsystem 150. The COR subsystem 120 can be coupled to the first transfer subsystem 150 and one or more substrates (not shown) can be transferred 121 between the COR subsystem 120 and the first transfer subsystem 150. The deposition subsystem 130 can be coupled to the first transfer subsystem 150 and one or more substrates (not shown) can be transferred 131 between the deposition subsystem 130 and the first transfer subsystem 150. The evaluation subsystem 140 can be coupled to the first transfer subsystem 150 and one or more substrates (not shown) can be transferred 141 between the evaluation subsystem 140 and the first transfer subsystem 150. For example, the etching subsystem 110, the COR subsystem 120, the deposition subsystem 130, the evaluation subsystem 140, and the first transfer subsystem 150 can be part of a Tactras™ System available from Tokyo Electron Limited. In addition, the lithography subsystem 170 can be coupled to the second transfer subsystem 160 and one or more substrates (not shown) can be transferred 172 between the lithography subsystem 170 and the second transfer subsystem 160.

The etching subsystem 110 can comprise one or more road-lock (transfer) elements 112, one or more processing elements 113 and one or more controllers 114. The one or more load-lock elements 112 can be coupled to the one or more of the processing elements 113 and can be coupled 111 to the first transfer subsystem 150. In alternate embodiments, one or more of the processing elements 113 may be coupled to the first transfer subsystem 150. The one or more controllers 114 can be coupled to the one or more load-lock elements 112 and/or to the one or more processing elements 113.

The COR subsystem 120 can comprise one or more load-lock elements 122, one or more processing elements 123, and one or more controllers 124. One or more load-lock elements 122 can be coupled to the one or more processing elements 123 and can be coupled 121 to the first transfer subsystem 150. In alternate embodiments, one or more of the processing elements 123 may be coupled to the first transfer subsystem 150. One or more controllers 124 can be coupled to the one or more load-lock elements 122 and/or to the one or more processing elements 123.

The deposition subsystem 130 can comprise one or more load-lock elements 132, one or more processing elements 133, and one or more controllers 134. The one or more load-lock elements 132 can be coupled to the one or more of the processing elements 133 and can be coupled 131 to the first transfer subsystem 150. In alternate embodiments, one or more of the processing elements 133 may be coupled to the first transfer subsystem 150. The one or more controllers 134 can be coupled to the one or more load-lock elements 132 and/or to the one or more processing elements 133.

The evaluation subsystems 140 can comprise one or more load-lock elements 142, one or more evaluation elements 143, and one or more controllers 144. The one or more load-look elements 142 can be coupled to the one or more of the evaluation elements 143 and can be coupled 141 to the first transfer subsystem 150. In alternate embodiments, one or more of the evaluation elements 143 may be coupled to the first transfer subsystem 150. The one or more controllers 144 can be coupled to the one or more load-lock elements 142 and/or to the one or more evaluation elements 143.

Operational state data can be established for the subsystems (110, 120, 130, 140, 150, 160, and 170) and can be used and/or updated by gate-optimization procedures. In addition, operational state data can be established for the load-lock elements (112, 122, 132, and 142), processing elements (113, 123, 133, and 143), and transfer elements (154 and 164) and can be updated by gate-optimization procedures. For example, the operational state data for the processing elements can include availability data, matching data for the processing elements, expected processing times for some process steps and/or sites, confidence data and/or risk data for the processing elements, or confidence data and/or risk data for one or more gate-optimization procedure. Updated operational states can be obtained by querying in real-time one or more processing elements, and/or one or more subsystems. Updated loading data can be obtained by querying in real-time one or more transfer elements, and/or one or more transfer subsystems.

The first transfer subsystem 150 can comprise transfer elements 154 that can be coupled to delivery elements (155, 156, and 157). Transfer elements 154 and/or delivery elements (155, 156, and 157) can be used to receive substrates, transfer substrates, align substrates, store substrates, and/or delay substrates. The second transfer subsystem 160 can comprise transfer elements 164 that can be coupled to delivery elements (165, 166, and 167). Transfer elements 164 and/or delivery elements (165, 166, and 167) can be used to receive substrates, transfer substrates, align substrates, store substrates, and/or delay substrates. Alternatively, other transferring means may be used. The first transfer subsystem 150 and the second transfer subsystem 160 can load, transfer, store, and/or unload gate-optimization substrates based on a processing sequence, a transfer sequence, operational states, the substrate and/or processing states, the processing time, the current time, the substrate data, the number of sites on the substrate, the type of sites on the substrates, the number of required sites, the number of completed sites, the number of remaining sites, or confidence data, or any combination thereof.

The one or more controllers (114, 124, 134, and 144) can be coupled to the system controller 190 and/or to each other using a data transfer subsystem 191. Alternatively, other coupling configurations may be used. The controllers can be coupled in series and/or in parallel and can have one or more input ports and/or one or more output ports. For example, the controllers may include 8-bit, 16-bit, 32-bit, and/or 64-bit processors having one or more core processing elements.

In addition, subsystems (110, 120, 130, 140, 150, 160, and 170) can be coupled to each other and to other devices using intranet, internet, wired, and/or wireless connections. The controllers (114, 124, 134, 144, and 190) can be coupled to external devices as required.

One or more of the controllers (114, 124, 134, 144, and 190) can be used when performing real-time gate-optimization procedures. A controller can receive real-time data to update subsystem, processing element, process, recipe, profile, and/or model data. One or more of the controllers (114, 124, 134, 144, and 190) can be used to exchange one or more Semiconductor Equipment Communications Standard (SECS) messages with the MES 180, read and/or remove information, feed forward, and/or feedback the information, and/or send information as a SECS message. In addition, controllers (114, 124, 134, 144, and 190) can include memory (not shown) as required. For example, the memory (not shown) can be used for storing information and instructions to be executed by the controllers, and may be used for storing temporary variables or other intermediate information during the execution of instructions by the various computers/processors in the processing system 100. One or more controller's (114, 124, 134, 144, and 190), or other system components can comprise the means for reading data and/or instructions from a computer readable medium and can comprise the means for writing data and/or instructions to a computer readable medium.

The processing system 100 can perform a portion of or all of the processing steps of the invention in response to the computers/processors in the processing system executing one or more sequences of one or more instructions contained in a memory and/or received in a message. Such instructions may be received from another computer, a computer readable medium, or a network connection.

In some embodiments, an integrated system can be configured using system components from Tokyo Electron Limited (TEL). In other embodiments, external subsystems and/or tools may be included. One or more of the subsystems (110, 120, 130, 140, and 170) can include one or more etch elements, deposition elements, integrated-metrology (IM) elements, Atomic Layer Deposition (ALD) elements, measurement elements, ionizations elements, polishing elements, coating elements, developing elements, cleaning elements, exposure elements, and thermal treatment elements. In addition, measurement elements can be provided that can include a CD-Scanning Electron Microscopy (CDSEM) system, a Transmission Electron Microscopy (TEM) system, a focused ion beam (FIB) system, an Optical Digital Profilometry (ODP) system, an Atomic Force Microscope (AFM) system, or another optical metrology system. The subsystems and/or processing elements can have different interface requirements, and the controllers can be configured to satisfy these different interface requirements.

One or more of the subsystems (110, 120, 130, 140, and 170) can comprise control applications, Graphical User Interface (GUI) components, and/or database components 195. Subsystems (110, 120, 130, 140, and 170), controllers (114, 124, 134, 144, and 190), can include Advanced Process Control (APC) applications, Fault Detection and Classification (FDC), and/or Run-to-Run (R2R) applications. In some embodiments, ARC applications, FDC applications, and/or R2R applications can be performed.

Output data and/or messages from gate-optimization procedures can be used in subsequent procedures to optimize the process accuracy and precision. Data can be passed to gate-optimization procedures in real-time as real-time variable parameters, overriding current model default values and narrowing the search space for resolving accurate results. Real-time data can be used with a library-based system, or regression-based system, or any combination thereof to optimize a gate-optimization procedure.

In some embodiments, the evaluation subsystem 140 can include an integrated Optical Digital Profilometry (iODP) elements (not shown), and iODP elements/systems are available from Timbre Technologies Inc. (a TEL company). Alternatively, other metrology systems may be used. For example, iODP techniques can be used to obtain real-time data that can include critical dimension (CD) data, gate structure data, and thickness data, and the wavelength ranges for the iODP data can range from less than approximately 200 nm to greater than approximately 900 nm. Exemplary iODP elements can include ODP Profiler Library elements, Profiler Application Server (PAS) elements, and ODP Profiler Software elements. The ODP Profiler Library elements can comprise application specific database elements of optical spectra and its corresponding semiconductor profiles, CDs, and film thicknesses. The PAS elements can compose at least one computer that connects with optical hardware and computer network. The PAS elements can be configured to provide the data communication, ODP library operation, measurement process, results generation, results analysis, and results output. The ODP Profiler Software elements can include the software installed on PAS elements to manage measurement recipe, ODP Profiler library elements, ODP Profiler data, ODP Profiler results search/match, ODP Profiler results calculation/analysis, data communication, and PAS interface to various metrology elements and computer network.

The evaluation subsystem 140 can use polarizing reflectometry, spectroscopic ellipsometry, reflectometry, or other optical measurement techniques to measure accurate device profiles, accurate CDs, and multiple layer film thickness of a substrate. The integrated metrology process (iODP) can be executed as an integrated process in an integrated group of subsystems. In addition, the integrated process eliminates the need to break the substrate for performing the analyses or waiting for long periods for data from external systems. iODP techniques can be used with the existing thin film metrology systems for inline profile and CD measurement, and can be integrated with TEL processing systems and/or lithography systems to provide real-time process monitoring and control. An exemplary optical metrology system is described in U.S. Pat. No. 6,913,900, entitled GENERATION OF A LIBRARY OF PERIODIC GRATING DIFFRACTION SIGNAL, by Niu, et al., issued on Sep. 13, 2005, and is incorporated in its entirety herein by reference.

Simulated diffraction signals can be generated by applying Maxwell's equations and using a numerical analysis technique to solve Maxwell's equations. For example, various numerical analysis techniques, including variations of rigorous coupled wave analysis (RCWA), can be used with multi-layer structures. For a more detail description of RCWA, see U.S. Pat. No. 6,891,626, titled CACHING OF INTRA-LAYER CALCULATIONS FOR RAPID RIGOROUS COUPLED-WAVE ANALYSES, filed on Jan. 25, 2001, issued May 10, 2005, which is incorporated herein by reference in its entirety.

An alternative procedure for generating a library of simulated-diffraction signals can include using a machine learning system (MLS). Prior to generating the library of simulated-diffraction signals, the MLS is trained using known input and output data. For example, the MLS may be trained with a subset of the gate-optimization library data. In one exemplary embodiment, simulated diffraction signals can be generated using a MLS employing a machine learning algorithm, such as back-propagation, radial basis functions support vectors kernel regression, and the like. For a more detailed description of machine learning systems and algorithms, see "U.S. patent application Ser. No. 10/608,300, titled OPTICAL METROLOGY OF STRUCTURES FORMED ON SEMICONDUCTOR WAFERS USING MACHINE LEARNING SYSTEMS, filed on Jun. 27, 2003, which is incorporated herein by reference in its entirety.

For detailed description of metrology model optimization, refer to U.S. patent application Ser. No. 10/206,491, OPTIMIZED MODEL AND PARAMETER SELECTION FOR OPTICAL METROLOGY, by Vuong, et al., filed Jun. 27, 2002; Ser. No. 10/946,729, OPTICAL METROLOGY MODEL OPTIMIZATION BASED ON GOALS, by Vuong, et al., filed Sep. 21, 2004; and U.S. patent application Ser. No. 11/061,303, OPTICAL METROLOGY OPTIMIZATION FOR REPETITIVE STRUCTURES, by Vuong, et al., filed on Apr. 27, 2004, all of which are incorporated herein by reference in their entireties.

When a regression-based process is used, a measured diffraction signal measured off the patterned structure can be compared to simulated diffraction signals. The simulated diffraction signals can be iteratively generated based on sets of profile parameters, to get a convergence value for the set of profile parameters that generates the closest match simulated diffraction signal compared to the measured diffraction signal. For a more detailed description of a regression-based process, see U.S. Pat. No. 6,785,638, titled METHOD AND SYSTEM OF DYNAMIC LEARNING THROUGH A REGRESSION-BASED LIBRARY GENERATION PROCESS, issued on Aug. 31, 2004, which is incorporated herein by reference in its entirety.

When a library-based process is used, an optical metrology data library can be generated and/or enhanced using gate-optimization procedures, recipes, profiles, and/or models. For example, a gate-optimization evaluation library can comprise simulated and/or measured optical signals and corresponding set of profile parameters. A detailed description of generating optical metrology data such as a library of simulated diffraction signals and corresponding set of profile parameters is described in U.S. Pat. No. 6,913,900, entitled GENERATION OF A LIBRARY OF PERIODIC GRATING DIFFRACTION SIGNAL, by Niu, et al., issued on Sep. 13, 2005, and is incorporated in its entirety herein by reference. The regression-based and/or the library-based process can include gate-optimization procedures.

One or more of the controllers (114, 124, 134, 144, and 190) can perform APC, R2R, FDC, and/or procedures that can operate as control strategies, control plans, control models, and/or recipe managers to provide real-time processing. Control and/or analysis strategies/plans can cover multiple process steps within a substrate processing sequence, and can be used to analyze the real-time and/or collected data, and establish error conditions. An analysis procedure can be executed when a context is matched. During the execution of an analysis procedure, one or more analysis plans can be executed. A plan can create an error when a data failure occurs, an execution problem occurs, or a control problem occurs. A data collection plan and/or analysis plan can reject the data at one or more of the evaluation sites for a substrate or reject the data because a procedure fails. For example, dynamic context matching allows for custom configuration at each device and/or product.

In one embodiment, a procedure failure may not terminate a gate-optimization procedure. For example, a gate-optimization procedure can indicate a failure when a limit is exceeded. Successful procedures can create warning messages when limits are being approached. Pre-specified failure actions for procedures errors can be stored in a database, and can be retrieved from the database when an error occurs.

The processing elements (113, 123, 133, and 143) can process, measure, inspect, align, and/or store one or more substrates using gate-optimization procedures and/or other procedures. One or more of the load-lock elements (112, 122, 132, and 142), the first transfer subsystem 150, and/or the second transfer subsystem 160 can transfer, measure, inspect, align, and/or store one or more substrates using gate-optimization procedures and/or other procedures.

In some embodiments, the lithography subsystem 170 can perform coating procedures, thermal procedures, measurement procedures, inspection procedures, alignment procedures, and/or storage procedures on one or more substrates using procedures and/or procedures. For example, one or more lithography-related processes can be used to deposit one or more masking layers that can include photoresist material, and/or anti-reflective coating (ARC) material, and can be used to thermally process (bake) one or more of the masking layers. In addition, lithography subsystem 170 can be used to measure and/or inspect one or more of the masking layers and/or substrates.

In other embodiments, the lithography subsystem 170 can be used to perform wet and/or dry exposure procedures, and in other cases, the lithography subsystem 170 can be used to perform extreme ultraviolet (EUV) exposure procedures. Alternatively, lithography related subsystems, such as scanner subsystems, may be used.

The deposition subsystem 130 can comprise one or more processing elements 133 that can process, measure, inspect, align, and/or store one or more substrates. The load-lock element 132, the first transfer subsystem 150, and/or the second transfer subsystem 160 can transfer, measure, inspect, align, and/or store one or more substrates. In some embodiments, the deposition subsystem 130 can comprise one or more processing elements 133 that can perform deposition procedures, inspection procedures, measurement procedures, alignment procedures, and/or storage procedures on one or more substrates using procedures and/or procedures. For example, one or more of the processing elements 133 can be used to perform physical vapor deposition (PVD) procedures, chemical vapor deposition (CVD) procedures, ionized physical vapor deposition (iPVD) procedures, atomic layer deposition (ALD) procedures, plasma enhanced atomic layer deposition (PEALD) procedures, and/or plasma enhanced chemical vapor deposition (PECVD) procedures. Evaluation procedures and/or inspection procedures can be used to measure and/or inspect one or more surfaces of the substrates.

The evaluation subsystem 140 can comprise one or more evaluation elements 143 that can evaluate, measure, inspect, align, verify, and/or store one or more substrates. One or more of the evaluation elements 143 and/or the load-lock elements 142 can transfer, measure, inspect, align, and/or store one or more substrates. In some embodiments, the evaluation subsystem 140 can perform evaluation procedures inspection procedures, temperature control procedures, measurement procedures, alignment procedures, verification procedures, and/or storage procedures on one or more substrates. For example, one or more of the evaluation elements 143 can be used to perform real-time optical metrology procedures that can be used to measure gate structures and/or thicknesses on the substrate. In addition, evaluation subsystem 140 can be used to determine substrate curvature or to measure and/or inspect one or more surfaces of the substrates. The evaluation subsystem 140 can perform evaluation procedures to determine if the substrate has been processed correctly or if a rework procedure is required.

In some embodiments, one or more of the subsystems (110, 120, 130, 140, and 170) can perform cleaning procedures, etching procedures, layer removal procedures, ashing procedures, inspection procedures, residue removal procedures, measurement procedures, alignment procedures, and/or storage procedures on one or more substrates using reworking procedures. For example, material can be removed from one or more patterned substrates using one or more plasma etching procedures, and/or non-plasma etching procedures. In addition, one or more processing subsystems can be used to remove damaged material from one or more of the substrates. Each subsystem can process one or more substrates in parallel, and one or more procedures and/or procedures can be performed.

One or more of the formatted messages can be exchanged between subsystems. The controllers can process messages and extract new data. When new data is available, a controller can either use the new data to update a gate-optimization recipe, profile, and/or model currently being used for the substrate and/or lot. When the controller uses the new data to update recipe data, profile data, and/or modeling data for the substrate lot currently being processed, the controller can determine if a recipe, a profile, and/or a model can be updated before the current substrate is processed. The current substrate can be processed using the updated recipe, profile, and/or model when the recipe, profile, and/or model can be updated before the current substrate is processed. The current substrate can be processed using a non-updated recipe, profile, and/or model when the data cannot be updated before the current substrate is processed. For example, when a new etching recipes, profiles, and/or models are available, an etching subsystem and/or etching controller may determine when to use the new etching recipes, profiles, and/or models. One or more controllers can use CD data, thermal data, thickness data, uniformity data, timing data, delay data, or optical properties data, or any combination thereof can be used to update an etching recipe, an etching profile, and/or an etching model.

One or more gate-optimization procedures can provide damage-assessment data that can include data for damaged layers, features, and/or structures for different sites, substrates, and/or lots. One or more processing subsystems can use the damage-assessment data to update, and/or optimize processing recipe data, process profile data, and/or modeling data. For example, the etching subsystem 110 can use "poly-Si swelling" data to update, and/or optimize an etching chemistry and/or etching time.

Gate-optimization procedures can be used to create, modify, and/or evaluate isolated and/or nested structures at different times and/or sites. For example, substrate thickness data can be different near isolated and/or nested structures, and substrate thickness data can be different near open areas and/or trench array areas. A processing subsystem can use new data for isolated and/or nested structures to update and/or optimize a process recipe and/or process time.

Gate-optimization procedures can use end-point detection (EPD) data and process time data to improve the accuracy. When EPD data is used to stop a gate-etch procedure, the EPD time data and the process rate data can be used estimate the amount of over-etch and/or estimate a thickness.

Evaluation subsystem 140 data can include measured and/or simulated signals associated with patterned structures or un-patterned structures, and the signals can be stored using processing, substrate, lot, recipe, site, or substrate location data. Measurement data can include variables associated with patterned structure profile, metrology device type and associated variables, and ranges used for the variables floated in the modeling and values of variables that were fixed in the modeling. The library data may include fixed and/or variable profile parameters (such as CD, sidewall angle, refractive index (n) data and extinction coefficient (k) data), and/or metrology device parameters (such as wavelengths, angle of incidence, and/or azimuth angle).

In some embodiments, gate-optimization procedures can use measured, predicted, and/or simulated diffraction signals to optimize an optical metrology recipe, structure, and/or model. Gate optimization procedures may utilize context/identification information such as site ID, substrate ID, slot ID, lot ID, recipe, state, and patterned structure ID as a means for organizing and indexing data. In some examples, the library data can include verified data associated with products, devices, substrates, procedures, lots, recipes, sites, locations, patterned and/or un-patterned structures.

Intervention and/or judgment rules can be defined in a strategy, plan, model, subsystem, element, or procedure and can be assigned to execute whenever a matching context is encountered. The intervention and/or judgment rules can be established for various gate-optimization procedures and can be maintained in the database.

In some examples, the MES 180 may be configured to monitor some system processes, and factory level intervention and/or judgment rules can be used to determine which processes are monitored and which data can be used. In addition, factory level intervention and/or judgment rules can be used to determine how to manage the data when a process can be changed, paused, and/or stopped. In addition, the MES 180 can provide configuration information and update information. Data can be exchanged using SEMI Equipment Communications Standard/Generic Equipment Model (SECS/GEM) communications protocols.

In some examples, a transfer system can use loading data to determine where to transfer a substrate. In other examples, a transfer system can use processing sequence data to determine where to transfer a substrate. In still other examples, a transfer system can use confidence data to determine where to transfer a substrate. Alternatively, other procedures may be used.

The confidence data can include an assessment of each process that was performed on the substrate. When processing data from a procedure is close to expected values, the confidence value for that procedure can be high, and when processing data from a procedure is not close to the expected values, the confidence value for that procedure can be low. For example, confidence values can range from zero to nine, where zero indicates a failure condition and nine indicates a correct performance.

In various embodiments, one or more input messages can be received and/or processed by one or more of the controllers (114, 124, 134, 144, and 190), and one or more output messages can be created and/or sent by one or more of the controllers (114, 124, 134, 144, and 190). In some examples, an input message can be a formatted message comprising real-time data and historical data. A controller can process a formatted message to create a message and/or a separate message for a subsystem. The message can include substrate data that can be used to reduce search times in libraries and databases, to reduce calculation errors, and to improve accuracy. For example, a smaller profile space within a library space can be identified using the gate-optimization data. In addition, gate-optimization data can be used and can allow an iODP procedure to determine gate-optimization profiles from the profile library in real-time, thereby decreasing measurement time and increasing throughput. The controller can examine the input message in real time to determines when the input message includes a gate-optimization message and/or data that it can use. In addition, the controller can determine how to extract in real-time the gate-optimization message and/or data. Messages can use Extensible Markup Language (XML) format and/or Standard Machine Language (SML) format. The system can provide and manage exception handling with messages that are being sent, split, and/or parsed for multiple subsystem.

The processing system 100 can be used to perform and/or verify one or more gate-optimization procedures. In some embodiments, one or more substrates can be received by one or more transfer subsystems (150, 160), and the transfer subsystems (150, 160) can transfer one or more of the substrates to one or more of the subsystems (110, 120, 130, 140, and 150) in the processing system 100.

One or more of the controllers (114, 124, 134, 144, and 190) can be configured for determining substrate data for each substrate, for determining one or more gate-optimization procedures using historical data and/or the real-time data, for establishing one or more gate-optimization procedures, for establishing a first number of substrates to be processed using the gate-optimization procedure, for determining operational state data for the one or more subsystems (110, 120, 130, 140, 150, 160, and 170), for determining loading data for the one or more transfer elements (154, 164) in the one or more transfer subsystems (150, 160).

In some embodiment, one or more of the transfer subsystems (150, 160) can be configured to transfer one or more substrates to one or more of the lithography subsystems 170. After the one or more substrates are transferred, one or more lithography-related procedures can be performed and a patterned masking layer can be created on one or more of the substrates. The patterned masking layer can include a plurality of gate-related features and one or more measurement features to be used during a gate-optimization procedure. One or more of the patterned substrates can be transferred to one or more evaluation subsystems 140 using one or more of the transfer subsystems (150, 160) and measurement data can be obtained for the one or more of the patterned substrates. The measurement data can include gate-optimization data. Next, one or more of the patterned substrates can be transferred to one or more of the etching subsystems 110, and one or more gate etch procedures can be performed.

In alternate embodiments, a chamber matching process can be performed using a gate-optimization procedure, the process can include A1) obtaining first real-time measurement data for a first substrate; A2) etching the first substrate in a first processing chamber using a first gate-etch procedure, the first gate-etch procedure being determined in real-time using the first real-time processing data, wherein first real-time processing data is established for the first substrate; A3) etching a second substrate in a second processing chamber using the first gate-etch procedure, wherein second real-time processing data is established for the second substrate; A4) obtaining first integrated metrology (IM) data for the first etched substrate; A5) obtaining second IM data for the second etched substrate; A6) establishing first feedback data for the first processing chamber using the first real-time measurement data, the first real-time processing data, or the first IM data, or any combination thereof; A7) establishing second feedback data for the first processing chamber using the first real-time measurement data, the second real-time processing data, or the second IM data, or any combination thereof; A8) establishing a first chamber matching value using the first feedback data, the second feedback data, the first IM data, or the second IM data, or any combination thereof; A9) etching an additional substrate in the first processing chamber using the first gate-etch procedure when the first chamber matching value is less than or equal to a first product requirement; and A10) updating the first gate-etch procedure when the first chamber matching value is greater than the first product requirement.

In various examples, the first product requirement data can be obtained by performing the first gate-etch procedure in a "golden" processing chamber, can be historical data that is stored in a library, and can be predicted data. For example, if we measure data for a first layer and use a multi-input multi-output (MIMO) model that predicts second layer data using the measured data for the first layer, the predicted result can be used as the first product requirement data.

In other alternate embodiments a gate-optimization procedure can be performed using a mufti-chamber system, the gate-optimization procedure can include. AA1) etching a first substrate using a first gate-etch procedure; AA2) etching a second substrate using the first gate-etch procedure; AA3) obtaining first feedback data (difference between the measure data from the first substrate and the first required data); AA4) establishing a first updated gate-etch procedure using the first gate-etch procedure and the first feedback data; AA5) etching a third substrate using the first updated gate-etch procedure; AA6) obtaining second feedback data (difference between the measure data from the second substrate and the first required data); AA7) establishing a second updated gate-etch procedure the using the first updated gate-etch procedure and the second feedback data; AA8) etching a fourth substrate using the second updated gate-etch procedure; AA9) obtaining third feedback data (difference between the measure data from the third substrate and the first required data); AA10) processing additional substrates when additional substrates are available and when the third feedback data is less than or equal to first threshold data; and AA11) refraining from processing additional substrates when additional substrates are not available or when the third feedback data is greater than first threshold data.

FIGS. 2A-2F show exemplary block diagrams of etching subsystems in accordance with embodiments of the invention.

Figure 2A:
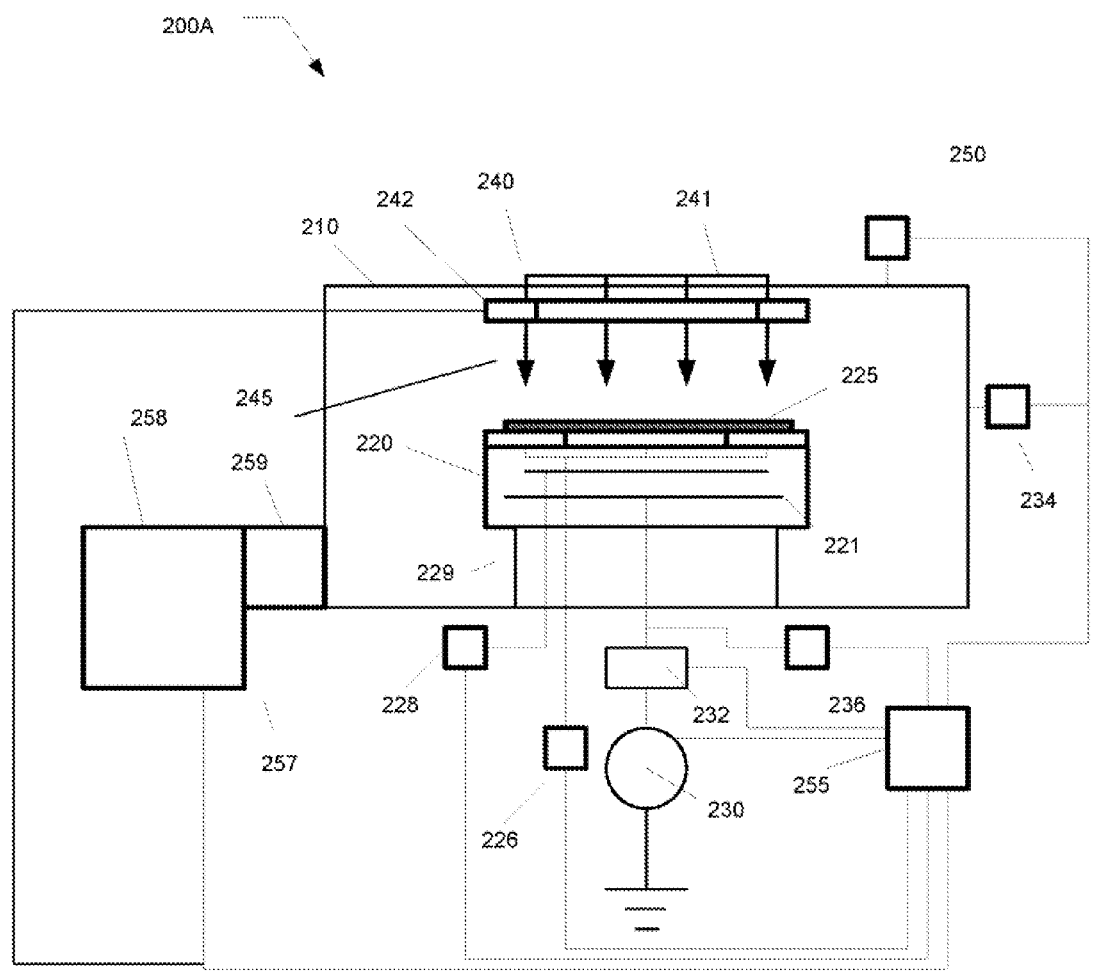
FIGS. 2A-2F shows exemplary block diagrams of etching subsystems in accordance with embodiments of the invention.

A first exemplary etching subsystem 200A is shown in FIG. 2A, and the illustrated etching subsystem 200A includes plasma processing chamber 210, substrate holder 220, upon which a substrate 225 to be processed is affixed, gas injection system 240, and vacuum pumping system 257. For example, substrate holder 220 can be coupled to and insulated from plasma processing chamber 210 using base 229. Substrate 225 can be, for example, a semiconductor substrate, a work piece, or a liquid crystal display (LCD). Plasma processing chamber 210 can be, for example, configured to facilitate the generation of plasma in processing region 245 adjacent a surface of substrate 225, where plasma is formed via collisions between heated electrons and an ionizable gas. An ionizable gas or mixture of gases is introduced via gas injection system 240, and process pressure is adjusted. Desirably, plasma is utilized to create materials specific to a predetermined material process, and to aid either the deposition of material to substrate 225 or the removal of material from the exposed surfaces of substrate 225. For example, controller 255 can be used to control vacuum pumping system 257 and gas injection system 240.

Substrate 225 can be, for example, transferred into and out of plasma processing chamber 210 through a slot valve (not shown) and chamber feed-through (not shown) via robotic transfer system where it is received by substrate lift pins (not shown) housed within substrate holder 220 and mechanically translated by devices housed therein. After the substrate 225 is received from transfer system, it is lowered to an upper surface of substrate holder 220.

For example, substrate 225 can be affixed to the substrate holder 220 via an electrostatic clamping system 228. Furthermore, substrate holder 220 can further include a temperature control system (not shown). Moreover, gas can be delivered to the backside of the substrate via a dual (center/edge) backside gas system 226 to improve the gas-gap thermal conductance between substrate 225 and substrate holder 220. A dual (center/edge) backside gas system can be utilized when additional temperature control of the substrate is required at elevated or reduced temperatures. For example, temperature control of the substrate can be useful at temperatures in excess of the steady-state temperature achieved due to a balance of the heat flux delivered to the substrate 225 from the plasma and the heat flux removed from substrate 225 by conduction to the substrate holder 220. In other embodiments, heating elements, such as resistive heating elements, or thermo-electric heaters/coolers can be included.

As shown in FIG. 2A, substrate holder 220 includes a lower electrode 221 through which Radio Frequency (RF) power can be coupled to plasma in processing region 245. For example, lower electrode 221 can be electrically biased at an RF voltage via the transmission of RF power from RF generator 230 through impedance match network 232 to lower electrode 221. The RF bias can serve to heat electrons to form and maintain plasma. A typical frequency for the RF bias can range from 1 MHz to 100 MHz and is preferably 13.56 MHz.

Alternatively, RF power may be applied to the lower electrode 221 at multiple frequencies. Furthermore, impedance match network 232 serves to maximize the transfer of RF power to plasma in processing chamber 210 by minimizing the reflected power. Various match network topologies and automatic control methods can be utilized.

With continuing reference to FIG. 2A, process gas can be introduced to processing region 245 through gas injection system 240. Process gas can, for example, include a mixture of gases such as argon, $CF_4$ and $O_2$, or argon, $C_4F_8$ and $O_2$ for oxide etch applications, or other chemistries such as, for example, $O_2/CO/Ar/C_4F_8$, $O_2/CO/Ar/C_5F_6$, $O_2/CO/Ar/C_4F_6$, $O_2/Ar/C_4F_6$, $N_2/H_2$. Gas injection system 240 can be configured to reduce or minimize the introduction of contaminants to substrate 225 and can include a gas injection plenum 241, and a multi-orifice showerhead gas injection plate 242. For example, process gas can be supplied from a gas delivery system (not shown). Gas injection system 240 can provide different flow rates to different regions of the processing region 245. Alternatively, gas injection system 240 may provide different process gasses to different regions of the processing region 245.

For example, vacuum pumping system 257 can include a turbo-molecular vacuum pump (TMP) 258 capable of a pumping speed up to 5000 liters per second (and greater) and a gate valve 259 for controlling the chamber pressure. In conventional plasma processing devices utilized for dry plasma etch processes, a 1000 to 3000 liter per second TMP is generally employed. TMPs are useful for low pressure processing, typically less than 50 mTorr. At higher pressures, the TMP pumping speed falls off dramatically. For high pressure processing (i.e. greater than 100 mTorr), a mechanical booster pump and dry roughing pump can be used. Furthermore, a device for monitoring chamber pressure (not shown) may be coupled to the process chamber 210. The pressure-measuring device can be, for example, a Type 628B Baratron absolute capacitance manometer commercially available from MKS Instruments, Inc. (Andover, Mass.).

As depicted in FIG. 2A, etching subsystem 200A can include one or more sensors 250 coupled to plasma processing chamber 210 to obtain performance data, and controller 255 coupled to the sensors 250 to receive performance data. The sensors 250 can include both sensors that are intrinsic to the plasma processing chamber 210 and sensors extrinsic to the plasma-processing chamber 210. Intrinsic sensors can include those sensors pertaining to the functionality of plasma processing chamber 210 such as the measurement of the Helium backside gas pressure, Helium backside flow, electrostatic clamping (ESC) voltage, ESC current, substrate holder 220 temperature (or lower electrode (LEL) temperature), coolant temperature, upper electrode (UEL) temperature, forward RF power, reflected RF power, RF self-induced DC bias, RF peak-to-peak voltage, chamber wall temperature, process gas flow rates, process gas partial pressures, chamber pressure, capacitor settings (i.e., C1 and C2 positions), a focus ring thickness, RF hours, focus ring RF hours, and any statistic thereof. Alternatively, extrinsic sensors can include one or more optical devices 234 for monitoring the light emitted from the plasma in processing region 245 as shown in FIG. 2A, and/or one or more electrical measurement devices 236 for monitoring the electrical system of plasma processing chamber 210 as shown in FIG. 2A. The optical devices 234 can include an optical sensor that can be used as an End Point Detector (EPD) and can provide EPD data. For example, an Optical Emissions Spectroscopy (OES) sensor may be used.

The electrical measurement device 236 can include a current and/or voltage probe, a power meter, or spectrum analyzer. For example, electrical measurement devices 236 can include a RF impedance analyzer. Furthermore, the measurement of an electrical signal, such as a time trace of voltage or current, permits the transformation of the signal into frequency domain using discrete Fourier series representation (assuming a periodic signal). Thereafter, the Fourier spectrum (or for a time varying signal, the frequency spectrum) can be monitored and analyzed to characterize the state of a plasma. In alternate embodiments, electrical measurement device 236 can include a broadband RF antenna useful for measuring a radiated RF field external to plasma processing chamber 210.

Controller 255 includes a microprocessor, memory, and a digital I/O port (potentially including D/A and/or A/D converters) capable of generating control voltages sufficient to communicate and activate inputs to etching subsystem 200 as well as monitor outputs from etching subsystem 200. As shown in FIG. 2A, controller 255 can be coupled to and exchange information with RF generator 230, impedance match network 232, gas injection system 240, vacuum pumping system 257, backside gas delivery system 226, electrostatic clamping system 228, optical device 234, electrical measurement device 236, and sensors 250. A program stored in the memory is utilized to interact with the aforementioned components of an etching subsystem 200 according to a stored process recipe.

In the exemplary embodiment shown in FIG. 2B, the etching subsystem 200B can be similar to the embodiment of FIG. 2A and further comprise either a stationary, or mechanically or electrically rotating magnetic field system 260, in order to potentially increase plasma density and/or improve plasma processing uniformity, in addition to those components described with reference to FIG. 2A. Moreover, controller 255 can be coupled to magnetic field system 260 in order to regulate the speed of rotation and field strength. The design and implementation of a rotating magnetic field is well known to those skilled in the art.

Figure 2B:
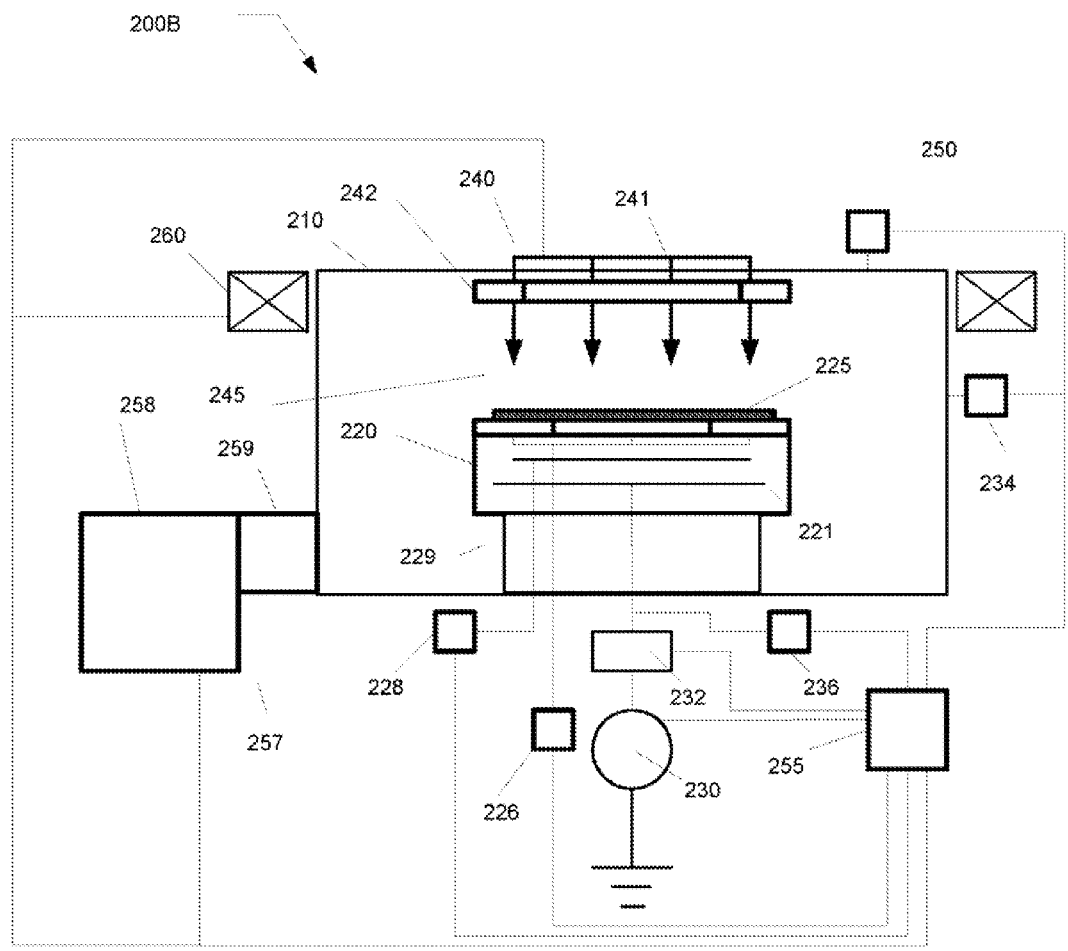
Figure 2C:
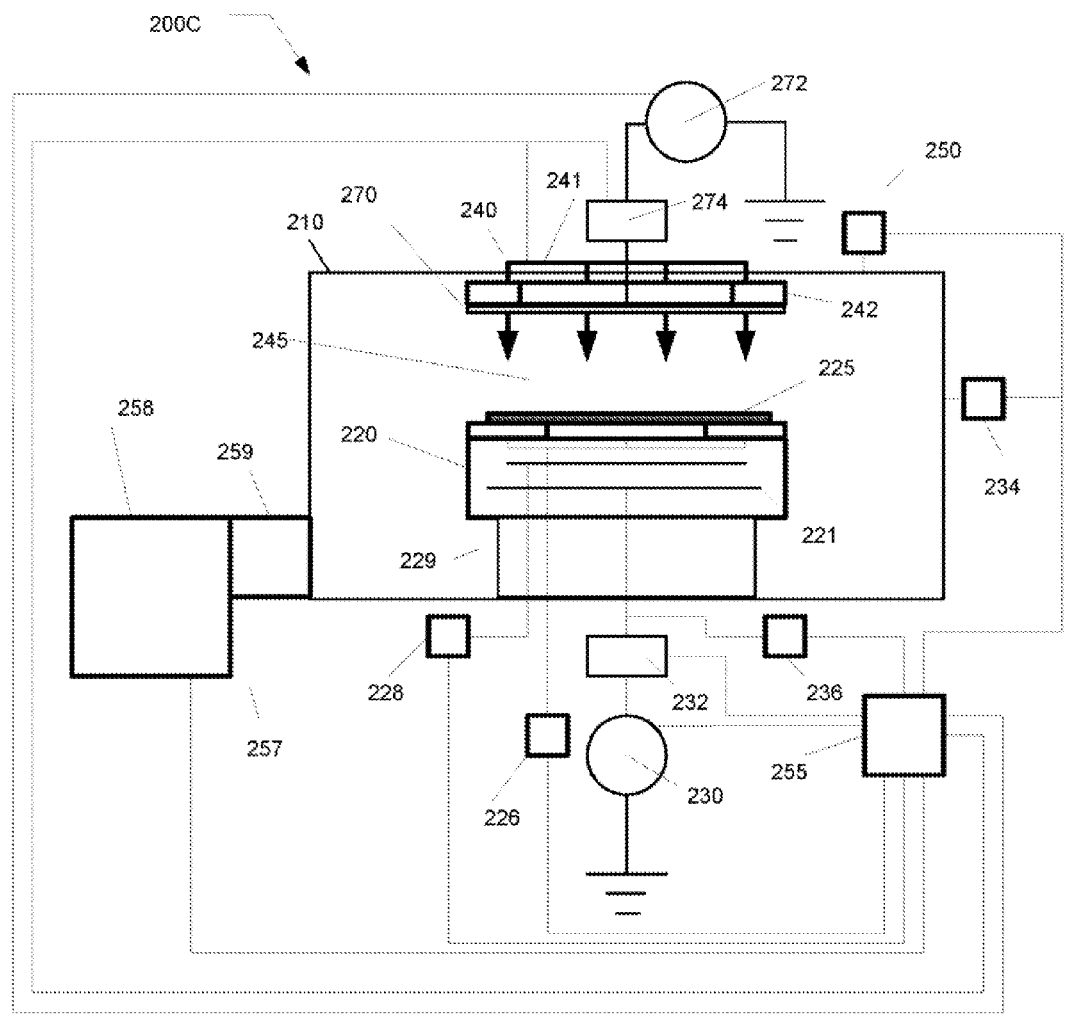

In the embodiment shown in FIG. 2C, the etching subsystem 200C can be similar to the embodiment of FIG. 2A or FIG. 2B, and can further comprise an upper electrode 270 to which RF power can be coupled from RF generator 272 through optional impedance match network 274. A frequency for the application of RF power to the upper electrode can range from about 0.1 MHz to about 200 MHz. Additionally, a frequency for the application of power to the lower electrode 221 can range from about 0.1 MHz to about 100 MHz. Moreover, controller 255 can be coupled to RF generator 272 and impedance match network 274 in order to control the application of RF power to upper electrode 270. The design and implementation of an upper electrode is well known to those skilled in the art. The upper electrode 270 and the gas distribution system 240 can be coupled to each other as shown.

Figure 2D:
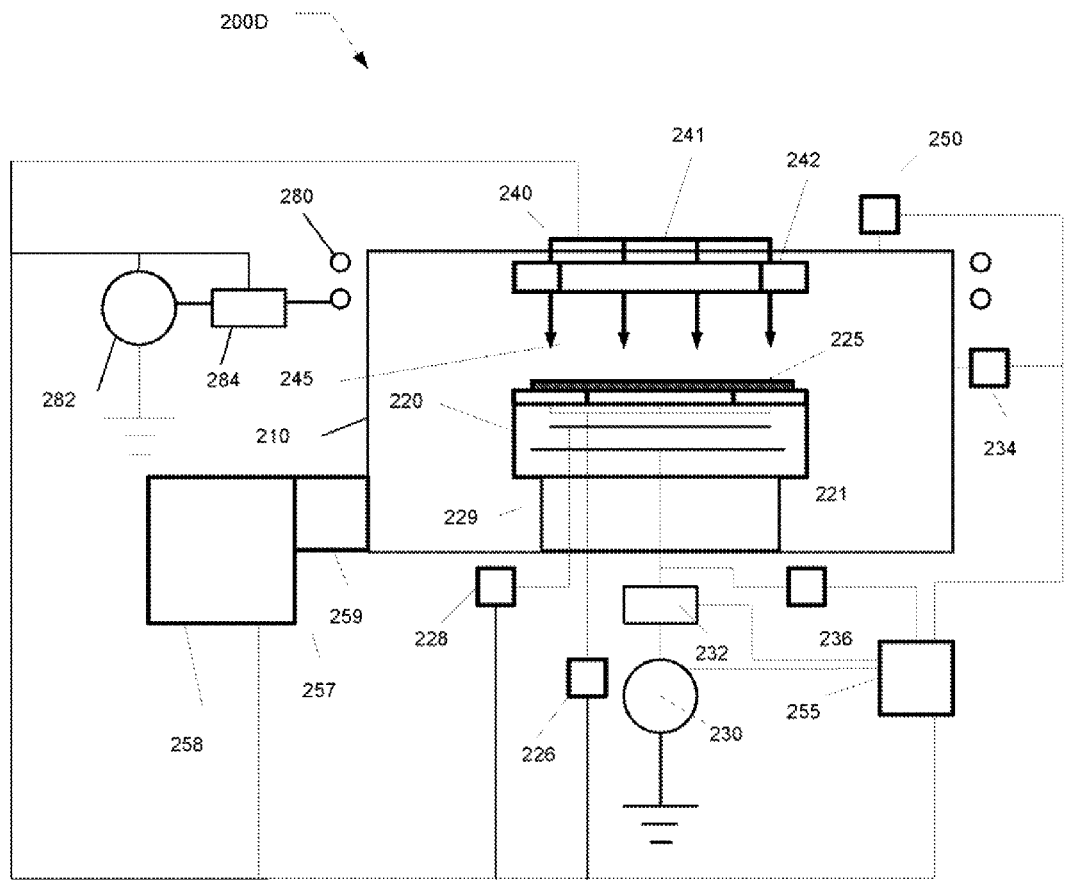

In the embodiment shown in FIG. 2D, the etching subsystem 200D can be similar to the embodiments of FIGS. 2A and 2B, and can further comprise an inductive coil 280 to which RF power can be coupled via RF generator 282 through optional impedance match network 284. RF power is inductively coupled from inductive coil 280 through a dielectric window (not shown) to plasma processing region 245. A frequency for the application of RF power to the inductive coil 280 can range from about 10 MHz to about 100 MHz. Similarly, a frequency for the application of power to the lower electrode 221 can range from about 0.1 MHz to about 100 MHz. In addition, a slotted Faraday shield (not shown) can be employed to reduce capacitive coupling between the inductive coil 280 and plasma. Moreover, controller 255 can be coupled to RF generator 282 and impedance match network 284 in order to control the application of power to inductive coil 280.

In an alternate embodiment (not shown), is a "spiral" coil or "pancake" coil configuration may be used for the inductive coil. The design and implementation of an inductively coupled plasma (ICP) source, or transformer coupled plasma (TCP) source, is well known to those skilled in the art.

Figure 2E:
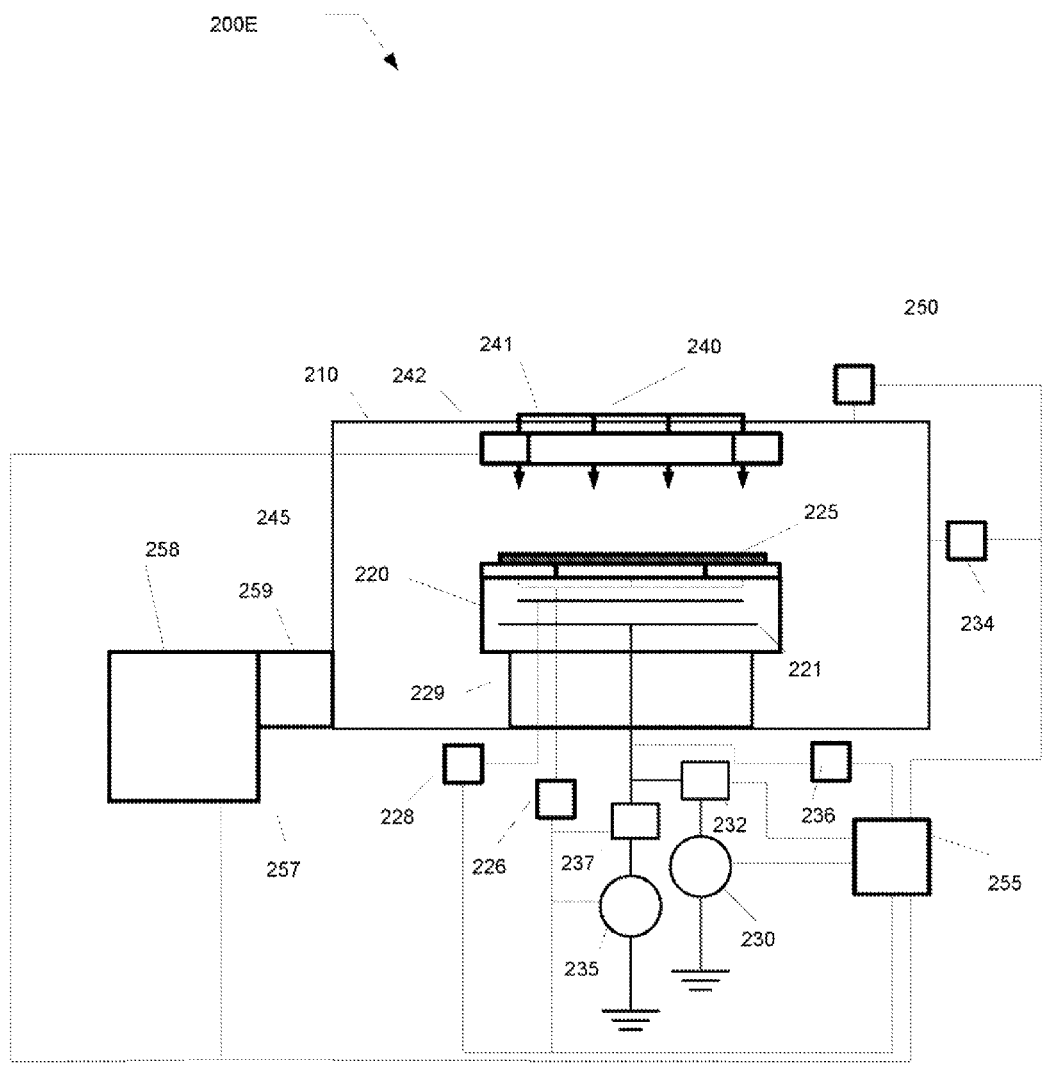

In the embodiment shown in FIG. 2E, the etching subsystem 200E can for example, be similar to the embodiments of FIGS. 2A, 2B, 2C, and 2D, and can further comprise a second RF generator 235 configured to couple RF power to substrate holder 220 through another optional impedance match network 237. A typical frequency for the application of RF power to substrate holder 220 can range from about 0.1 MHz to about 200 MHz for either the first RF generator 230 or the second RF generator 235 or both. The RF frequency for the second RF generator 235 can be relatively greater than the RF frequency for the first RF generator 230. Furthermore, the RF power to the substrate holder 220 from the first RF generator 230 can be amplitude modulated, the RF power to the substrate holder 220 from the second RF generator 235 can be amplitude modulated, or both RF powers can be amplitude modulated. Desirably, the RF power at the higher RF frequency is amplitude modulated. Moreover, controller 255 can be coupled to the second RF generator 235 and impedance match network 237 in order to control the application of RF power to substrate holder 220. The design and implementation of an RF system for a substrate holder is well known to those skilled in the art.

Figure 2F:
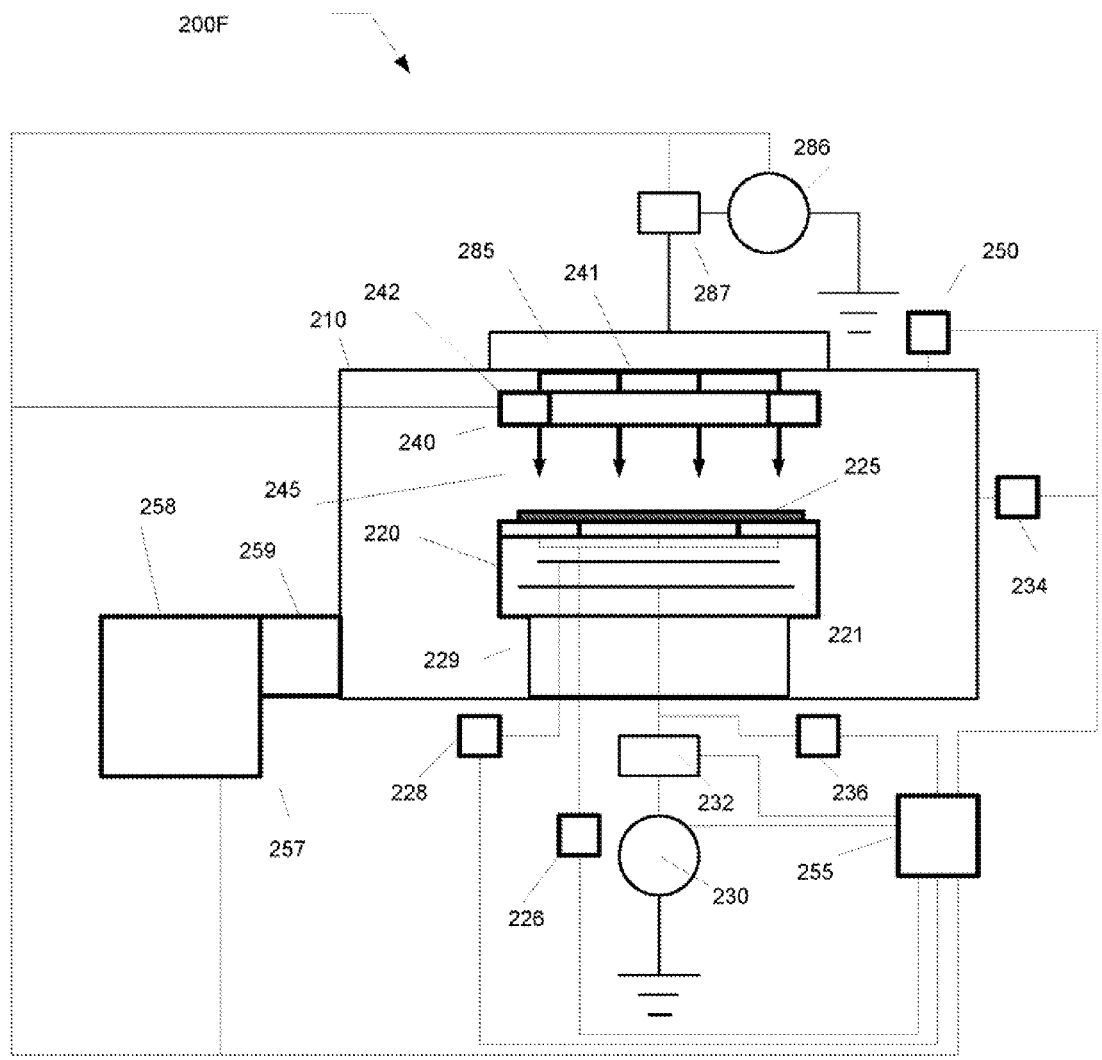
Figure 3A:
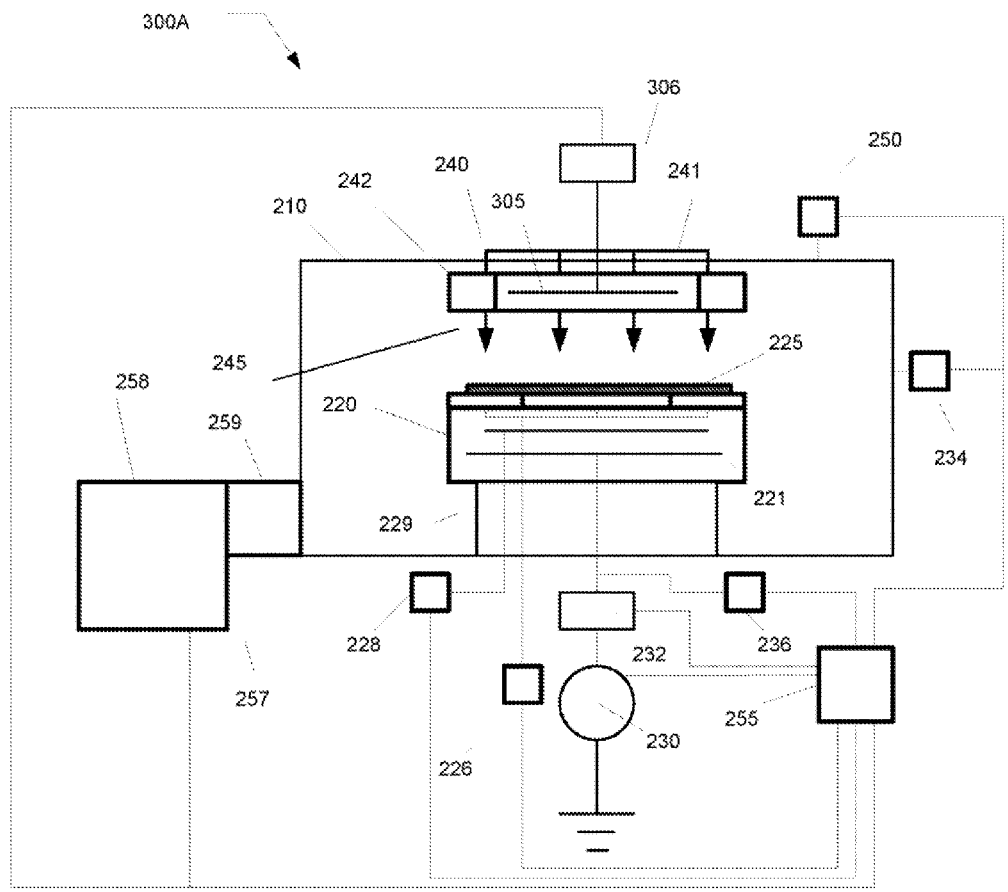
FIGS. 3A-3F shows exemplary block diagrams of additional etching subsystems in accordance with embodiments of the invention.
Figure 3B:
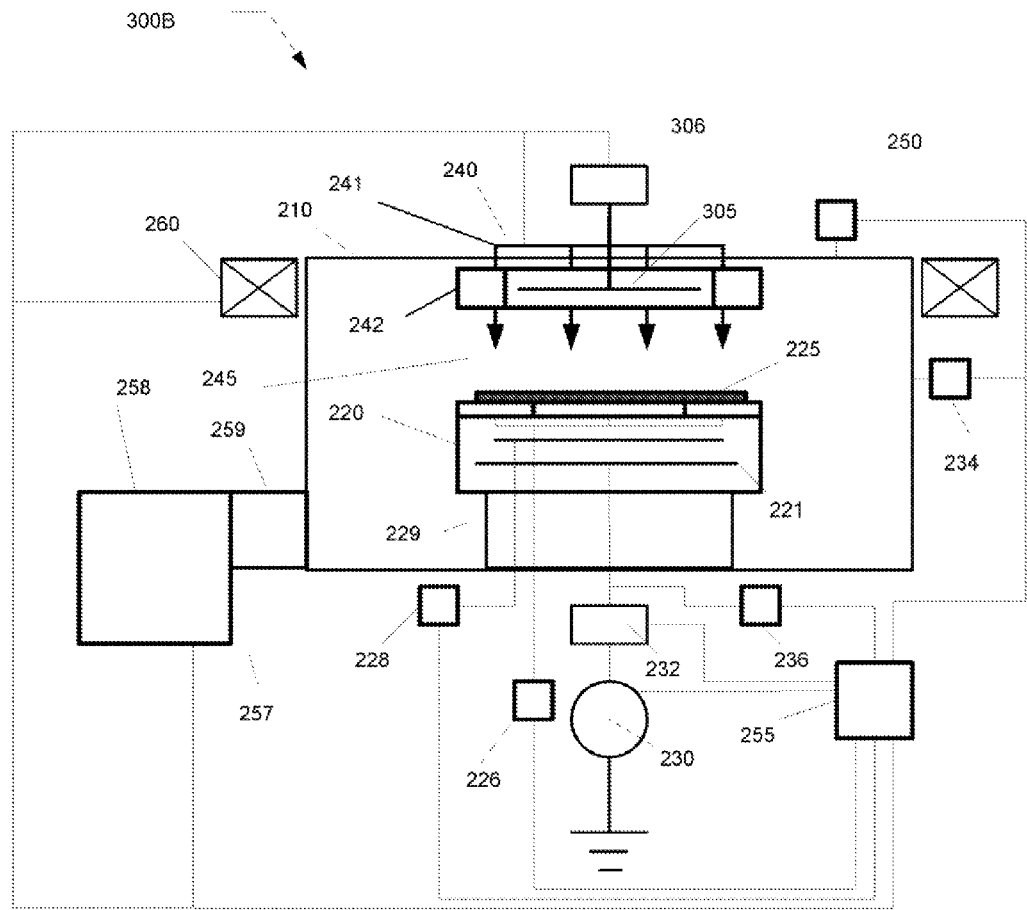
Figure 3C:
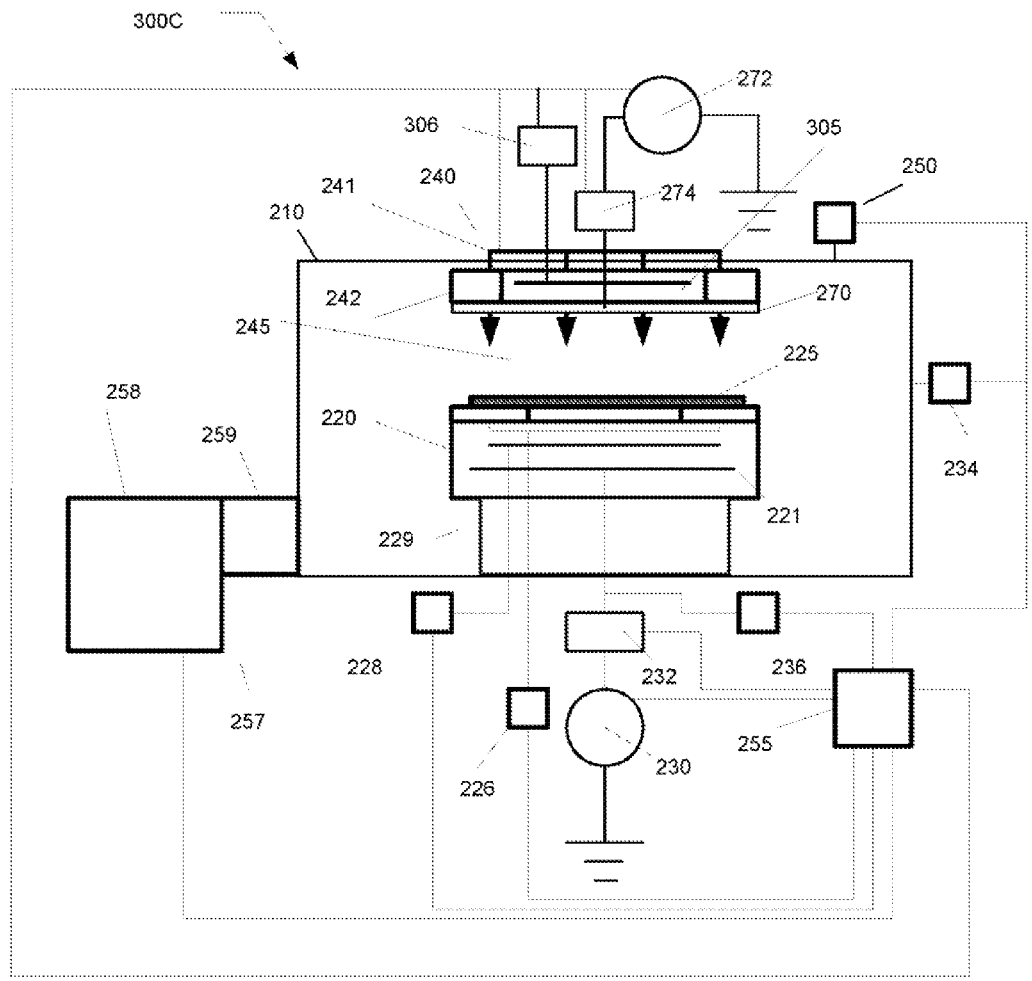
Figure 3D:
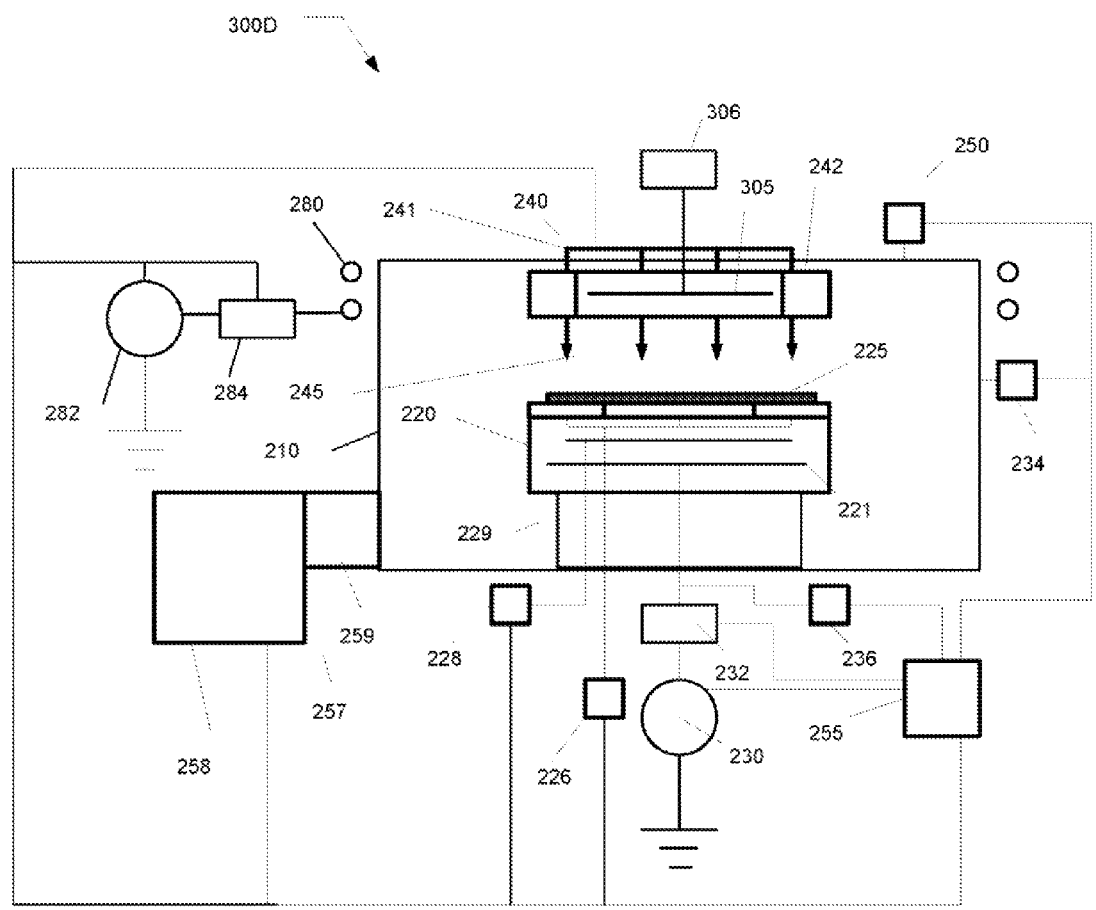
Figure 3E:
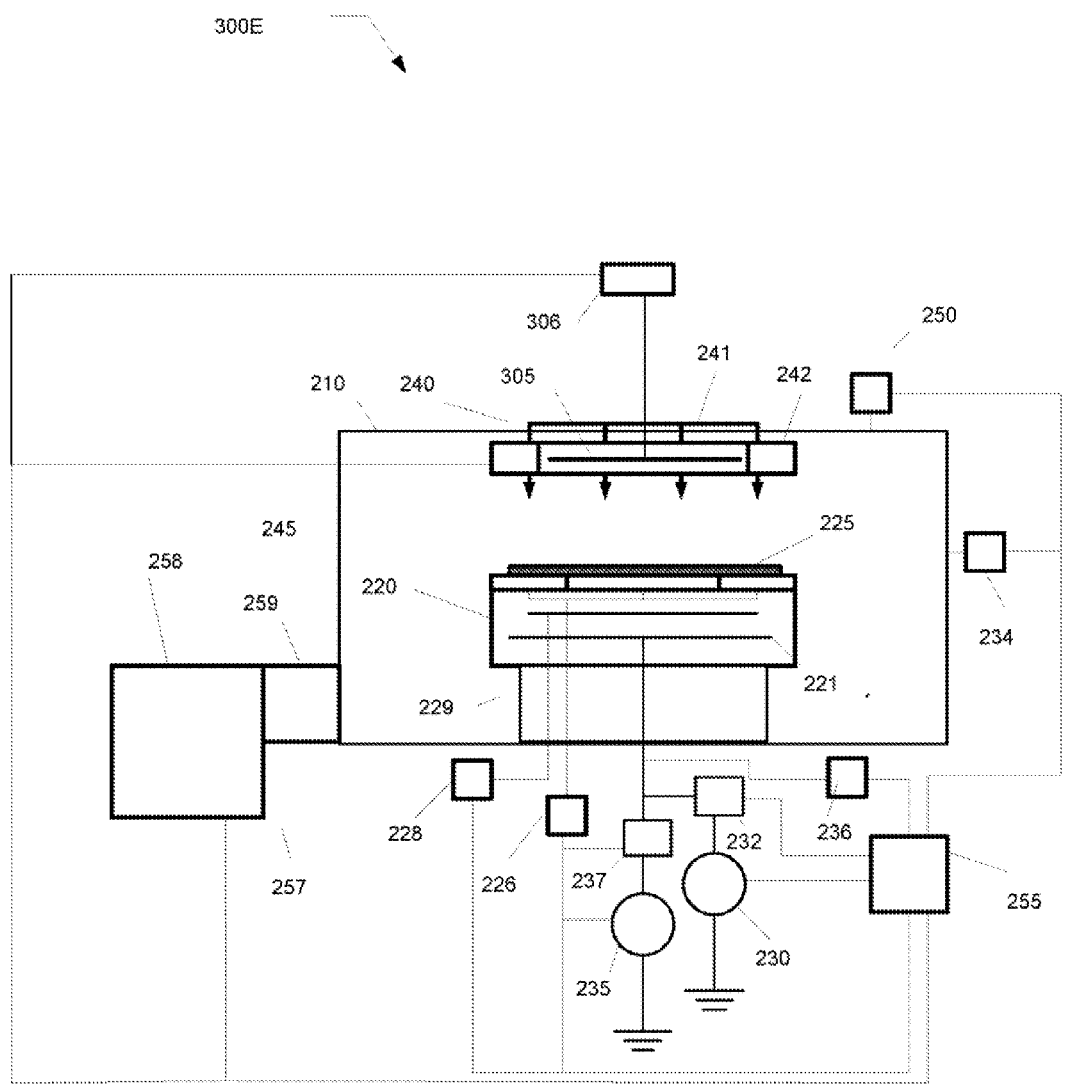
Figure 3F:
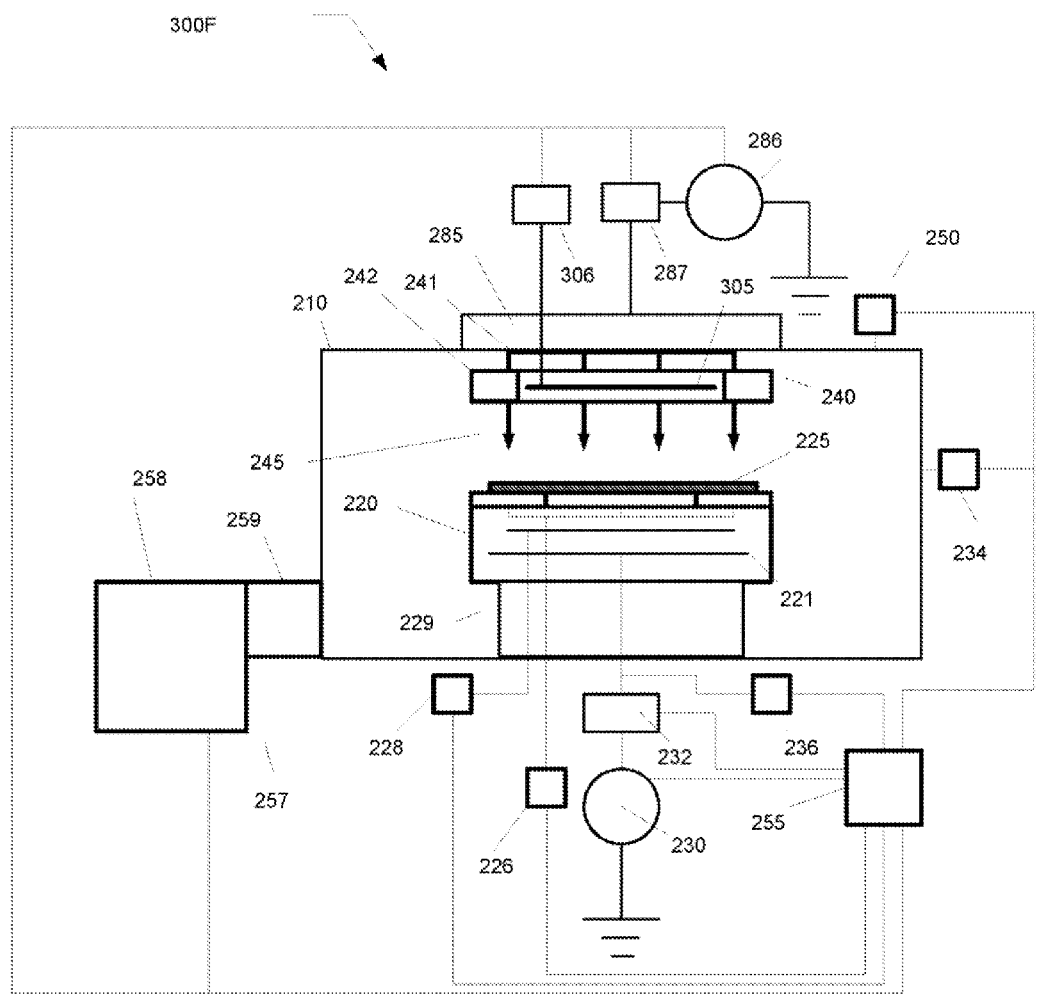

In the embodiment shown in FIG. 2F, the etching subsystem 200F can be similar to the embodiments of FIGS. 2A and 2E, and can further comprise a surface wave plasma (SWP) source 285. The SWP source 285 can comprise a slot antenna, such as a radial line slot antenna (RLSA), to which microwave power is coupled via microwave generator 286 through optional impedance match network 287.

FIGS. 3A-3F show additional embodiments for etching subsystems in accordance with embodiments of the invention. FIGS. 3A-3F illustrate exemplary etching subsystems 300A-300F that are similar to the exemplary etching subsystems 200A-200F shown in FIGS. 2A-2F, but etching subsystems 300A-300F include at least one DC electrode 305 and at least one DC source 306.

During patterned etching, a dry plasma etching process is often utilized, and the plasma is formed from a process gas by coupling electro-magnetic (EM) energy, such as radio frequency (RF) power, to the process gas in order to heat electrons and cause subsequent ionization and dissociation of the atomic and/or molecular composition of the process gas. In addition, negative, high voltage direct current (DC) electrical power ran be coupled to the plasma processing system in order to create an energetic (ballistic) electron beam that strikes the substrate surface during a fraction of the RF cycle, i.e., the positive half-cycle of the coupled RF power. It has been observed that the ballistic electron beam can enhance the properties of the dry plasma etching process by, for example, improving the etch selectivity between the underlying thin film (to be etched) and the mask layer, reducing charging damage such as electron shading damage, etc. Additional details regarding the generation of a ballistic electron beam are disclosed in pending U.S. patent application Ser. No. 11/156,559, entitled "Plasma processing apparatus and method" and published as US patent application no. 2006/0037701A1: the entire contents of which are herein incorporated by reference in their entirety. In general, the ballistic electron beam can be implemented within various types of plasma processing system, as shown in FIGS. 3A-3F.

The DC electrode 305 may comprise a silicon-containing material and/or a doped silicon-containing material. The DC source 306 can include a variable DC power supply. Additionally, the DC source 306 can include a bipolar DC power supply. The DC source 306 can further include a system configured to perform at least one of monitoring, adjusting, or controlling the polarity, current, voltage, and/or on/off state of the DC source 306. Once plasma is formed, the DC source 306 facilitates the formation of a ballistic electron beam. An electrical filter may be utilized to de-couple RF power from the DC source 306.

For example, the DC voltage applied to DC electrode 305 by DC source 306 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage.

Figure 4:
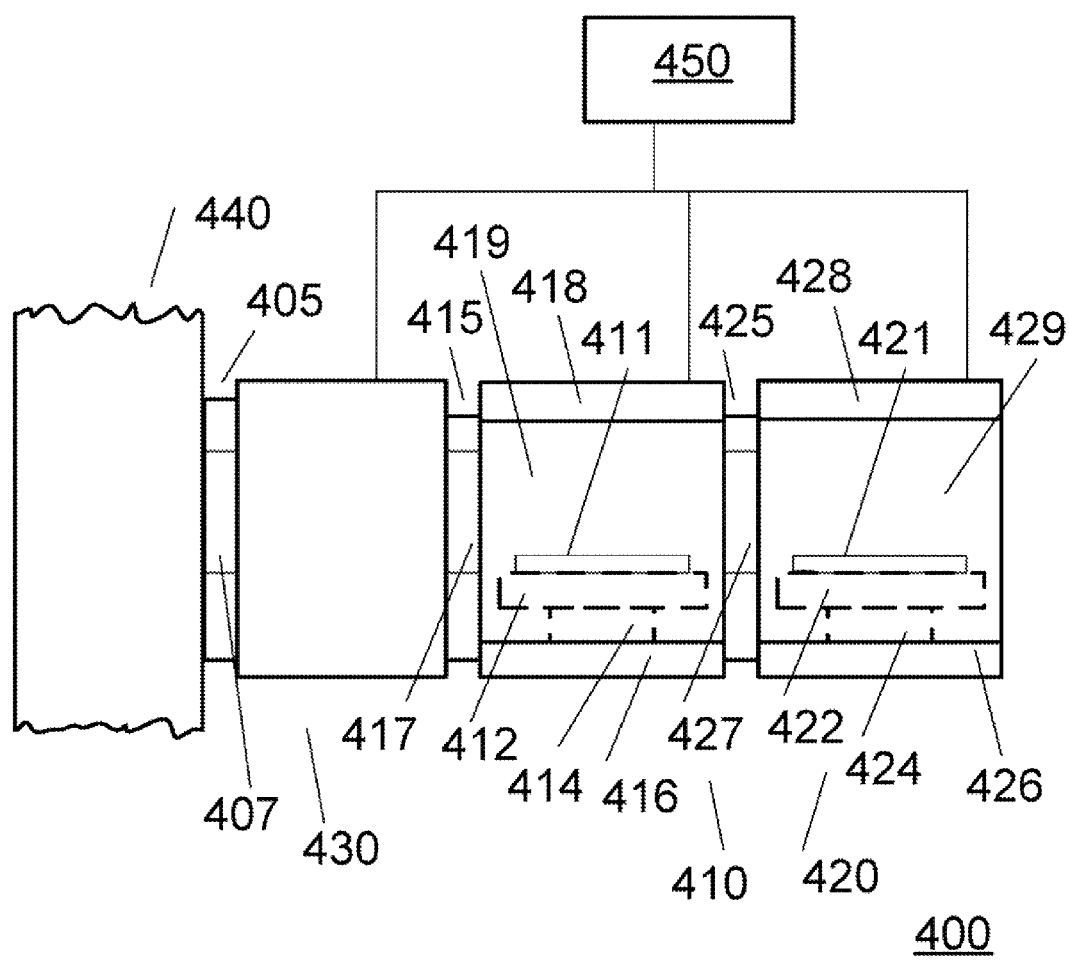
FIG. 4 shows an exemplary block diagram of a trimming subsystem in accordance with embodiments of the invention.
Figure 5:
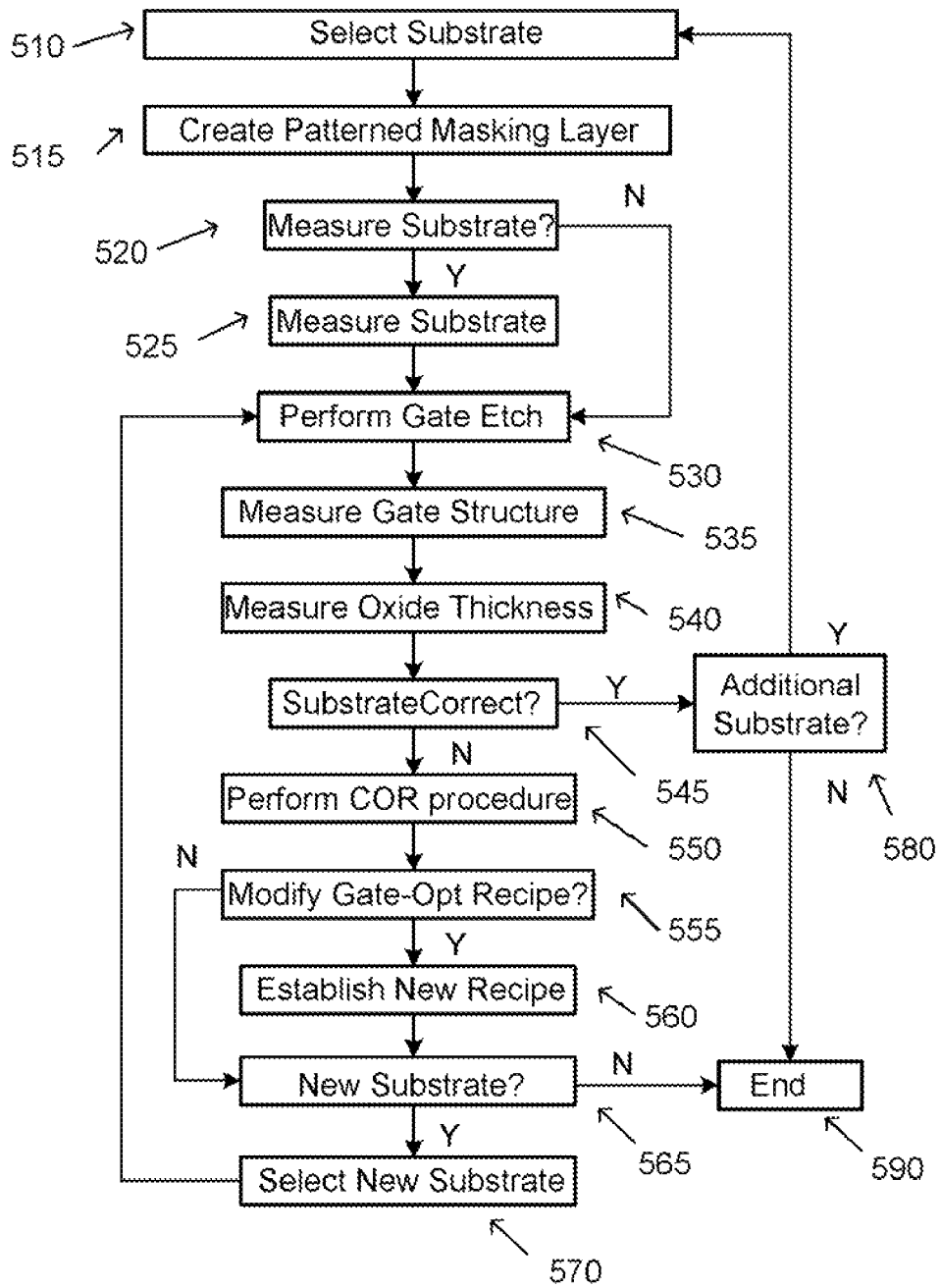
FIG. 5 illustrates an exemplary flow diagram of a method for processing substrates using procedures in accordance with embodiments of the invention.

FIG. 4 shows an exemplary block diagram of a trimming subsystem in accordance with embodiments of the invention. In the illustrated embodiment, a chemical oxide removal (COR) system 400 is shown, and the COR system can be used for layer trimming. The COR system 400 comprises a chemical treatment subsystem 410, a thermal treatment subsystem 420, and a transfer subsystem 430. Alternatively, the COR system 400 may comprise a substrate rinsing system (not shown). The transfer subsystem 430 can be coupled to the chemical treatment subsystem 410 in order to transfer substrates into and out of the chemical treatment subsystem 410 and the thermal treatment subsystem 420, and exchange substrates with a multi-element manufacturing system 440. For example, the chemical treatment subsystem 410, the thermal treatment subsystem 420, and the transfer subsystem 430 can be included in a processing system such as the Tactras™ System or Certas System (a chemical treatment sub-system) from Tokyo Electron Limited. The multi-element manufacturing system 440 can comprise etch systems, deposition systems, coating systems, patterning systems, integrated metrology systems, etc. In order to isolate the processes occurring in the chemical treatment subsystem 410, the thermal treatment subsystem 420, and the transfer subsystem 430, isolation assemblies (405, 415, and 425) can be utilized to couple the subsystems to each other. For instance, the isolation assemblies (405, 415, and 425) can provide thermal isolation and can include gate valve assemblies (407, 417, and 427) to provide vacuum isolation. Alternatively, the chemical treatment subsystem 410, the thermal treatment subsystem 420, and the transfer subsystem 430 can be configured differently.

In general, at least one of the chemical treatment subsystem 410, the thermal treatment subsystem 420, and the transfer subsystem 430 comprises at least two transfer openings to permit the passage of the substrate therethrough. For example, as depicted in FIG. 4, the chemical treatment subsystem 410 can comprise two transfer openings, the first transfer opening permits the passage of the substrate between the chemical treatment subsystem 410 and the transfer subsystem 430 and the second transfer opening permits the passage of the substrate between the chemical treatment subsystem 410 and the thermal treatment subsystem 420. In addition, the transfer subsystem 430 can comprise two transfer openings, the first transfer opening permits the passage of the substrate between the chemical treatment subsystem 410 and the transfer subsystem 430, and the second transfer opening permits the passage of the substrate between the transfer subsystem 430 and the multi-element manufacturing system 440.

The chemical treatment subsystem 410 can comprise a temperature controlled substrate holder 412 configured to be substantially thermally isolated from the other components of the chemical treatment subsystem 410 and can be configured to support a substrate 411. Element 414 can be used to couple and isolate the temperature controlled substrate holder 412. The chemical treatment subsystem 410 can also comprise a vacuum pumping system 416 for controlling process pressures, and a gas distribution system 418 for providing one or more process gasses during processing and/or cleaning. For example, vacuum pumping system 416 may include a vacuum pump and a gate valve (not shown) for controlling the chamber pressure, and the process gas can comprise NH3, HF, H2, O2, CO, CO2, Ar, He, etc.

In addition, the substrate holder 412 can comprise an electrostatic clamping system (not shown) in order to electrically clamp substrate 411 to the substrate holder 412, a temperature control system (not shown) for controlling the substrate holder temperature, and a multi-zone backside gas system (not shown) to improve the gas-gap thermal conductance between substrate 411 and substrate holder 412. In other embodiments, heating/cooling elements, such as resistive heating elements, or thermo-electric heaters/coolers can be included in the substrate holder 412, as well as other components of the chemical treatment subsystem 410. Alternatively, other clamping means may be used.

The thermal treatment subsystem 420 can comprise a temperature controlled substrate holder 422 configured to be substantially thermally isolated from the other components of the thermal treatment subsystem 420 and can be configured to support a substrate 421. Element 424 can be used to couple and isolate the temperature controlled substrate holder 422. The thermal treatment subsystem 420 can also comprise a vacuum pumping system 426 for controlling process pressures, and a temperature controlled upper assembly 428 for controlling temperatures and providing one or more process gasses during processing and/or cleaning. For example, vacuum pumping system 426 may include a vacuum pump and a gate valve (not shown) for controlling the chamber pressure, and the process gas can comprise N2, NH3, HF, H2, O2, CO, CO2, Ar, He, etc. Alternatively, other gasses may be used during vaporization of chemically treated surface layer.

In addition, the substrate holder 422 can comprise an electrostatic clamping system (not shown) in order to electrically clamp substrate 421 to the substrate holder 422, a temperature control system (not shown) for controlling the substrate holder temperature, and a multi-zone backside gas system (not shown) to improve the gas-gap thermal conductance between substrate 421 and substrate holder 422. In other embodiments, heating/cooling elements, such as resistive heating elements, or thermo-electric heaters/coolers can be included in the substrate holder 422, as well as other components of the thermal treatment subsystem 420.

Substrates can be transferred between the chemical treatment subsystem 410, the thermal treatment subsystem 420, and the transfer subsystem 430. During processing, the chemical treatment subsystem 410, the thermal treatment subsystem 420, and/or the transfer subsystem 430 can be sealed using one or more of the gate valve assemblies (407, 417, and 427) in order to permit independent processing in the subsystems (410, 420, and 430). The chemical treatment subsystem 410, the thermal treatment subsystem 420, and the transfer subsystem 430 can be temperature-controlled and can be thermally insulated from one another.

The COR system 400 can further comprise a controller 450 having a microprocessor, memory, and a digital I/O ports configured to transmit signals to the chemical treatment subsystem 410, the thermal treatment subsystem 420, and/or the transfer subsystem 430 as well as receive signals from the chemical treatment subsystem 410, the thermal treatment subsystem 420, and/or the transfer subsystem 430.

When a COR procedure is performed, a substrate can be transferred to the chemical treatment subsystem 410 from the transfer subsystem 430. The substrate can be secured to the substrate holder 412 and a heat transfer gas can be supplied to the backside (center and edge) of the substrate. Next, a first COR recipe can be established for the COR procedure, and the first COR recipe can comprise a number of processing parameters that can include a chemical treatment processing pressure, a chemical treatment wall temperature, a chemical treatment substrate holder temperature, a chemical treatment substrate temperature, a chemical treatment gas distribution system temperature, or a chemical treatment gas flow rate, or any combination thereof. Then, the substrate can be chemically treated for a first time using the first OR recipe. The first time can range from 10 to 480 seconds, for example.

In addition, the substrate can be transferred from the chemical treatment subsystem 410 to the thermal treatment subsystem 420. The substrate can be secured to the substrate holder 422 and a heat transfer gas can be supplied to the backside (center and edge) of the substrate. Next, a second COR recipe can be established for the COR procedure, and the second COR recipe can comprise a number of processing parameters that can include a thermal treatment wall temperature, a thermal treatment upper assembly temperature, a thermal treatment substrate temperature, a thermal treatment substrate holder temperature, a thermal treatment substrate temperature, or a thermal treatment processing pressure, or any combination thereof. Then, the substrate can be thermally treated for a second time using the second COR recipe. The second time can range from 10 to 480 seconds, for example.

In a gate-optimization example, the COR system 400 can be used to remove or trim oxidized poly-Si material. Alternatively, the COR system 400 may be used to remove or trim an oxide masking layer. The COR system 400 can comprise a chemical treatment subsystem 410 for chemically treating exposed surface layers, such as oxide surface layers, on a substrate, whereby adsorption of the process chemistry on the exposed surfaces affects chemical alteration of the surface layers. Additionally, the COR system 400 can comprise thermal treatment subsystem 420 for thermally treating the substrate, whereby the substrate temperature is elevated in order to desorb (or evaporate) the chemically altered exposed surface layers on the substrate.

The COR system can be used to perform a dry, non-plasma etching process that can include a chemical process during which exposed surfaces of the dielectric layer are chemically treated by a process gas comprising HF, or ammonia (NH3), or both HF and NH3, and a desorption process during which the chemically altered surface layers can be removed. The desorption can comprise a thermal treatment process within which the temperature of the substrate is raised sufficiently high to permit the volatilization of the chemically altered surface layers. Using the dry, non-plasma etching process, the chemically treated material can be substantially removed.

During the chemical treatment process, each constituent of the process gas may be introduced together (i.e., mixed), or separately from one another (i.e., HF introduced independently from NH3). Additionally, the process gas can further include an inert gas, such as a noble gas (i.e., argon). The inert gas may be introduced with either the HF or the NH3, or it may be introduced independently from each of the aforementioned gaseous constituents. Further details regarding the introduction of a noble gas with NH3 in order to control the extent to which surface layers of the dielectric film are chemically altered is described in pending U.S. patent application Ser. No. 10/812,347, entitled "Processing system and method for treating a substrate", the entire contents of which are herein incorporated by reference in their entirety.

Additionally, during the chemical treatment process, the process pressure may be selected to affect the extent to which surface layers of the dielectric film are chemically altered. The process pressure can range from approximately 1 mtorr to approximately 100 torr. Additionally, the process pressure can range from about 1 to about 100 mTorr. Alternatively, the process pressure can range from about 2 to about 25 mTorr. Vacuum pumping system 416 and 426 can be configured to provide a uniform (three-dimensional) pressure field. The process gas flow rates can range from about 1 to about 5000 sccm for each specie. Alternatively, the flow rates can range from about 10 to about 500 sccm.

Furthermore, during the chemical treatment process, the substrate temperature may be selected to affect the extent to which surface layers of the dielectric film are chemically altered. The substrate temperature can range from approximately 10 degrees C. to approximately 200 degrees C. Further details regarding the setting of the substrate temperature in order to control the extent to which surface layers of the dielectric film are chemically altered is described in pending U.S. patent application Ser. No. 10/817,417, entitled "Method and system for performing a chemical oxide removal process", the entire contents of which are herein incorporated by reference in their entirety.

Additionally, the chemical treatment chamber 419 can be heated to a temperature ranging from about 10 degrees to about 200 degrees C. Alternatively, the chamber temperature can range from about 35 degrees to about 55 degrees C. Additionally, the gas distribution system 418 can be heated to a temperature ranging from about 10 degrees to about 200 degrees C. Alternatively, the gas distribution system temperature can range from about 40 degrees to about 80 degrees C. The substrate 411 can be maintained at a temperature ranging from about 10 degrees to about 50 degrees C. Alternatively, the substrate temperature can range form about 25 degrees to about 30 degrees C.

During the thermal treatment process, the substrate temperature can be elevated above approximately 50 degrees C., or desirably above approximately 100 degrees C. Additionally, an inert gas may be introduced during the thermal treatment of the substrate. The inert gas may include a noble gas or nitrogen.

In the thermal treatment system, the thermal treatment chamber 429 can be heated to a temperature ranging from about 20 degrees to about 200 degrees C. Alternatively, the chamber temperature can range from about 75 degrees to about 100 degrees C. Additionally, the upper assembly 428 can be heated to a temperature ranging from about 20 degrees to about 200 degrees C. Alternatively, the upper assembly temperature can range from about 75 degrees to about 100 degrees C. The substrate 421 can be heated to a temperature in excess of about 100 degrees C., for example, from about 100 degrees to about 200 degrees C. Alternatively, the substrate temperature can range from about 100 degrees to about 150 degrees C.

The COR system 400 can produce an etch amount of an exposed oxide surface layer in excess of 10 nm per 60 seconds for oxidized poly-Si, an etch amount of the exposed oxide surface layer in excess of 25 nm per 180 seconds for thermal oxide, and an etch amount of the exposed oxide surface layer in excess of 10 nm per 180 seconds for ozone TEOS. The COR system 400 can also produce an etch variation across a substrate of less than 2.5%.

When a gate-optimization procedure is performed, one or more of the controllers (114, 124, 134, 144, and 190) can be used. In some examples, evaluation decisions for a gate-optimization procedure can be made using the data from a first site, and the first site can be selected from the number of evaluation sites on the first gate-optimization substrate. The first site can have a first evaluation feature associated therewith that was created using the gate-optimization procedure. Gate-optimization evaluation data can be obtained from the first evaluation site oil the first gate-optimization substrate, and the first site can have first gate-optimization measurement and/or inspection data associated therewith. For example, gate-optimization measurement and/or inspection data can be obtained from one or more of the subsystems (110, 120, 130, 140, and 170). In addition, first gate-optimization verification data cans be established for the first site on the first gate-optimization substrate, and the first gate-optimization verification data can include verified gate-optimization measurement and/or inspection data that can be obtained from a gate-optimization evaluation library and/or database. Confidence data and/or risk data can be established for the first site using a first difference between the gate-optimization evaluation data and the gate-optimization verification data. The gate-optimization procedure can be identified as a verified gate-optimization procedure when a first verification limit is met, and the gate-optimization procedure can be identified as an un-verified gate-optimization procedure when a first verification limit is not met.

During some gate-optimization procedure, when a site is used, the number of required sites can be decreased by one, and the number of visited sites can be increased by one, and the gate-optimization procedure can have confidence data, risk data, and/or verification data associated therewith.

In some examples, when an evaluation procedure is performed, additional sites can be used on the first gate-optimization substrate. For example, evaluation decisions can be made using the data from a first site and data from one or more additional sites on the first gate-optimization substrate. When a new site is required, a new site can be selected from the number of evaluation sites on the first gate-optimization substrate, and the new site can have a new evaluation feature associated therewith that was created using the first gate-optimization procedure. The new site can have a new evaluation feature associated therewith that was created using the gate-optimization procedure. Gate-optimization evaluation data can be obtained from the new evaluation site on the first gate-optimization substrate, and the new site can have new gate-optimization measurement and/or inspection data associated therewith. For example, new gate-optimization measurement and/or inspection data can be obtained from one or more of the subsystems (110, 120, 130, 140, and 170). In addition, new gate-optimization verification data can be established for the new site on the first gate-optimization substrate, and the new gate-optimization verification data can include new verified gate-optimization measurement and/or inspection data that can be obtained from a gate-optimization evaluation library and/or database. New confidence data and/or risk data can be established for the new site using a new difference between the new gate-optimization evaluation data and the new gate-optimization verification data. The gate-optimization procedure can be identified as a verified gate-optimization procedure when a new verification limit is met, and the gate-optimization procedure can be identified as an un-verified gate-optimization procedure when the new verification limit is not met.

In other examples, when a gate-optimization procedure is being evaluated and/or performed, sites on additional gate-optimization substrates can be used. For example, evaluation decisions can be made using the data from sites on one or more gate-optimization substrates. One or more of the controllers (114, 124, 134, 144, and 190) can also be configured for establishing an additional gate-optimization evaluation procedure for an additional gate-optimization substrate.

One or more of the transfer subsystems (150, 160) can be configured for transferring one or more gate-optimization substrates to one of the subsystems (110, 120, 130, 140, and 170) before, during, and/or after a gate-optimization procedure is performed. In addition, the one or more of the transfer subsystems (150, 160) can be configured for delaying the additional gate-optimization substrate for a first amount of time using a transfer element (154, 164) in the transfer subsystems (150, 160), and the transfer element (154 and 164) can support two or more substrates. After a second amount of time, the additional gate-optimization substrate can be processed in one or more of the subsystems (110, 120, 130, 140, and 170). When delayed substrates are used, one or more of the controllers (114, 124, 134, 144, and 190) can also be configured to establish delayed confidence and/or risk data and to use the delayed data to make additional process corrections and/or improvements.

In various embodiments, the one or more processing elements (113, 123, 133, and 133) can include one or more lithography-related processing elements, one or more scanner-related processing elements, one or more inspection-related processing elements, one or more measurement-related elements, one or more evaluation-related elements, one or more etch-related processing elements, one or more deposition-related processing elements, one or more thermal processing elements, one or more coating-related processing elements, one or more alignment-related processing elements, one or more polishing-related processing elements, one or more storage-related elements, one or more transfer elements, one or more cleaning-related processing elements, one or more rework-related processing elements, one or more oxidation-related processing elements, one or more nitridation-related processing elements, or one or more external processing elements, or any combination thereof.

In addition, the gate-optimization procedure can be performed in real-time and can include one or more lithography-related procedures, one or more scanner-related procedures, one or more inspection-related procedures, one or more measurement-related procedures, one or more evaluation-related procedures, one or more etch-related procedures, one or more COR procedures, one or more deposition-related procedures, one or more thermal processing procedures, one or more coating-related procedures, one or more alignment-related procedures, one or more polishing-related procedures, one or more storage-related procedures, one or more transfer procedures, one or more cleaning-related procedures, one or more rework-related procedures, one or more oxidation-related procedures, one or more nitridation-related procedures, or one or more external procedures, or any combination thereof.

In some embodiments, the data used to evaluate/verify a gate-optimization procedure and/or structure can include intensity data, transmission data, absorption data, reflectance data, diffraction data, optical properties data, or image data, or any combination thereof. The verification data can include historical data, real-time data, optical metrology data, imaging data, particle data, CD-scanning electron microscope (COD-SEM) data, transmission electron microscope (TEM) data, and/or focused ion beam (FIB) data. The threshold limit data cans include goodness of fit data, CD data, accuracy data, wavelength data, sidewall data, particle data, process data, historical data, or a combination thereof.

In some gate-optimization examples, a first set of evaluation verification features can be created by developing an exposed masking layer, a second set of verification features can be created by etching one or more layers, and a third set of verification features can be created by using a COR procedure. In other examples, the second set of verification features can be created after the COR procedure. Confidence and/or risk data can be determined for the development procedure, the etching procedure, and the COR procedure.

The substrates can include one or more layers that can include semiconductor material, carbon material, dielectric material, glass material, ceramic material, metallic material, oxidized material, mask material, or planarization material, or a combination thereof.

In some examples, the lithography-related processing elements can perform mask layer deposition procedures, mask layer exposure procedures, and/or development procedures that subsequently can be used in gate optimization procedures.

When a product is being developed, one or more gate-optimization libraries can be created, refined, updated, and/or used, and the gate-optimization libraries can include features, properties, structures, procedures, images, and/or optical data. The processing system 100 can use gate-optimization procedures and/or gate-optimization evaluation procedures to create data for one or more evaluation libraries.

When a gate-optimization evaluation library is created, refined, and/or verified, one or more structures on a reference "golden" substrate can be used, and one or more of the controllers (114, 124, 134, 144, and 190) can be configured to perform the following steps: a) selecting a structure from a number of reference structures on the reference substrate, where the reference structure was created using a verified gate-optimization procedure; b) obtaining gate-optimization verification data from the reference structure, where the gate-optimization verification data includes gate-optimization measurement and/or inspection data from a reference structure produced using a verified gate-optimization procedure; c) establishing simulation data for the reference structure, where the simulation data comprises simulated measurement and/or inspection data for the reference structure produced using the verified gate-optimization procedure; d) establishing confidence data and/or risk data for the reference structure on the reference substrate using one or more differences calculated using the gate-optimization verification data and the simulation data; e) identifying the reference structure on the reference substrate as a verified structure, decreasing the number of required reference structures by one, increasing the number of examined reference structures by one, and storing data associated with the reference structure as verified data in the gate-optimization evaluation library, when a gate-optimization library creation limit is met; f) identifying the reference structure on the reference substrate as an unverified structure, decreasing the number of required reference structures by one, and increasing the slumber of examined reference structures by one, when the gate-optimization library creation limit is not met; g) repeating steps a)-f) when the number of required reference structures is greater than zero; and j) stopping the gate-optimization library creation process when the number of required reference structures is equal to zero.

One or more "golden" subsystems and/or "golden" processing elements may be used during gate-optimization processing. In addition, transfer and/or processing sequences can be used to eliminated and/or reduce "first wafer effects".

In other embodiments, one or more substrates can be processed using a verified gate-optimization procedure. When a verified gate-optimization procedure is performed, one or more gate-optimization-related reference structures can be created on a reference substrate ("golden wafer"). When a reference substrate is examined, a test reference structure can be selected from a number of gate-optimization-related reference structures on the reference substrate, and the test reference structure was created using the verified gate-optimization procedure. During the examination, gate-optimization-related examination data can be obtained from the test reference structure, and the gate-optimization-related examination data can include gate-optimization-related measurement and/or inspection data from the test reference structure produced using the verified gate-optimization procedure. A best estimate structure and associated best estimate data can be selected from a gate optimization library that includes gate structures and associated data. For example the data may include diffraction signals and/or spectra, refraction signals and/or spectra, reflection signals and/or spectra, or transmission signals and/or spectra, or any combination thereof. One or more differences can be calculated between the test reference structure and the best estimate structure from the library, the differences can be compared to matching criteria, creation criteria, or product requirements, or any combination thereof. For example, differences can be calculated between the intensity signals, transmission signals, reflected signals, diffraction signals, or diffraction spectra, or any combination thereof. When matching criteria are used, the test reference structure can be identified as a member of the gate-optimization evaluation library, and the current substrate can be identified as a reference substrate if the matching criteria are met.

When creation criteria are used, the test reference structure can be identified as a new member of the gate-optimization evaluation library, and the current substrate can be identified as a verified reference substrate if the creation criteria are met. When product requirement data is used, the test reference structure can be identified as a verified structure, and the substrate can be identified as verified production substrate if one or more product requirements are met. Corrective actions can be applied if one or more of the criteria or product requirements are not met. Gate-optimization-related confidence data and/or risk data can be established for the test reference structure using the test reference structure data and the best estimate structure data.

The verified gate-optimization procedure can include one or more gate-etch procedures and/or one or more COR-etch procedures. Alternatively, verified gate-optimization procedure may include transfer procedures and/or storage procedures.

When gate-optimization-related reference structures are produced and/or examined, accuracy and/or tolerance limits can be used. When these limits are not correct, refinement procedures can be performed. Alternatively, other procedures can be performed, other sites can be used, or other substrates can be used. When a refinement procedure is used, the refinement procedure can utilize bilinear refinement, Lagrange refinement, Cubic Spline refinement, Aitken refinement, weighted average refinement, multi-quadratic refinement, bi-cubic refinement, Turran refinement, wavelet refinement, Bessel's refinement, Everett refinement, finite-difference refinement, Gauss refinement, Hermite refinement, Newton's divided difference refinement, osculating refinement, or Thiele's refinement algorithm, or a combination thereof.

In some examples, corrective actions can include stopping the processing, pausing the processing, re-evaluating one or more of the gate-optimization substrates, re-measuring one or more of the gate-optimization substrates, re-inspecting one or more of the gate-optimization substrates, re-working one or more of the gate-optimization substrates, storing one or more of the gate-optimization substrates, cleaning one or more of the gate-optimization substrates, delaying one or more of the gate-optimization substrates, or stripping one or more of the gate-optimization substrates, or any combination thereof.

In some embodiments, the gate-optimization evaluation library data can include goodness of fit data, creation rules data, measurement data, inspection data, verification data, map data, confidence data, accuracy data, process data, or uniformity data, or any combination thereof.

Figure 8:
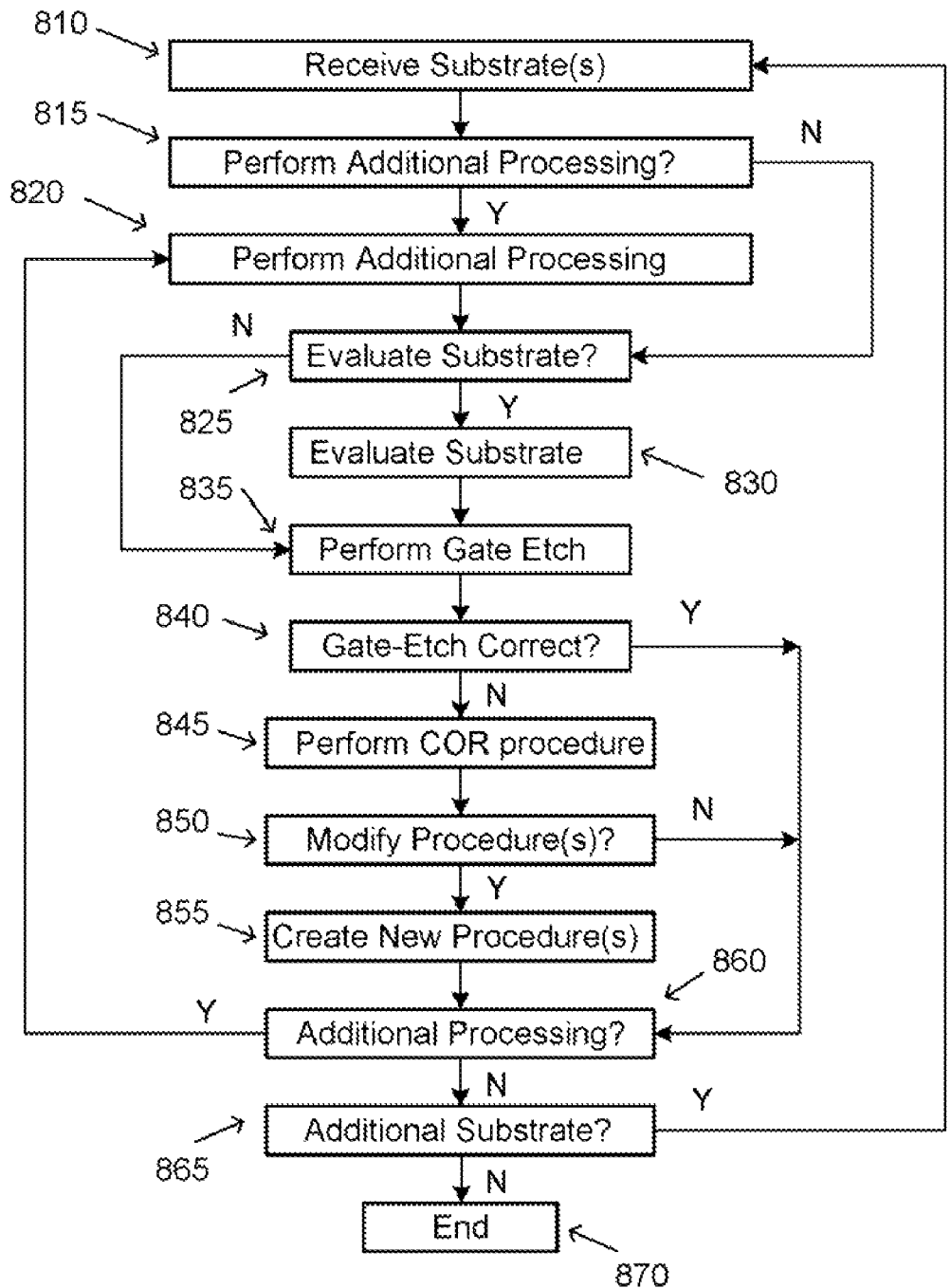
FIG. 8 illustrates an exemplary flow diagram of another method for processing substrates using procedures in accordance with embodiments of the invention.

FIG. 8 illustrates an exemplary flow diagram of another method for processing substrates using procedures in accordance with embodiments of the invention. The substrates can include one or more layers that can include semiconductor material, carbon material, dielectric material, glass material, ceramic material, metallic material, oxidized material, doped material, implanted material, mask material, or planarization material, or a combination thereof.

In some cases, gate etch procedures can be developed during the early stages of the production cycle and can be used throughout the production cycle, and in other cases, procedures when the more critical processing steps are performed. In some example, procedures may be used to account for mobility differences between Negative Channel Field Effect Transistor (nFET) structures and Positive Channel Field Effect Transistor (pFET) structures, to locate test structures, to improve line width roughness and/or line edge roughness, and to improve overlay problems.

In 505, one or more substrates can be received by one or more subsystems (101, 102, 110, 120, 130, 140, and 150) in a processing system (100). In some embodiments, one or more of the substrates can be received by one or more transfer subsystems (101, 102) coupled to one or more of the subsystems (110, 120, 130, 140, and 150). Alternatively, one or more of the substrates can be received by a different subsystem. In addition, a system controller 190 can be used to receive the substrate data for the one or more substrates. Alternatively, some of the substrate data may be received by a different controller. For example, the substrate data can include historical and/or real-time maps that can include gate-optimization maps, substrate-related maps, process-related maps, damage-assessment maps, reference maps, measurement maps, prediction maps, risk maps, inspection maps, verification maps, evaluation maps, particle maps, and/or confidence map(s) for one or more substrates. In some cases, a MES 180 system can exchange data with the system controller 190 and one or more of the subsystems (110, 120, 130, 140, and 170), and the data can be used to determine and/or control the gate-optimization procedure.

In 510, a substrate can be selected and the selected substrate can have a processing sequence associated with it. In some cases, each substrate can have a different processing sequence, or in other cases, several substrates can have the same processing sequence associated with them.

In 515, a patterned masking layer can be created on one or more substrates. For example, the lithography subsystem 170 and the evaluation subsystem 140 can be used to create a patterned masking layer on one or more substrates.

In 520, a query can be performed to determine when an evaluation procedure is required for the current substrate. When an evaluation procedure is required for the current substrate, procedure 500 can branch to 525, and when an evaluation procedure is not required for the current substrate, procedure 500 can branch to 530.

In some embodiments, an evaluation procedure may not be required for every substrate.

In 525, an evaluation procedure can be performed. Measurement data can be obtained using one or more sites on the substrate. In addition, evaluation and/or inspection data can be obtained using an evaluation procedure and/or an inspection procedure.

In 530, a gate etch procedure can be performed. For example, a first gate recipe can be performed in an SCCM Poly chamber and the processing conditions can include a chamber pressure of approximately 40 mTorr, a top electrode RF power level of approximately 240-260 watts, a bottom electrode RF power level of approximately 190-210 watts, a flow rate for a first process gas ($CHF_3$) of approximately 20-30 sccm, a flow rate for a second process gas (Ar) of approximately 450-500 sccm, a backside pressure of approximately 8-12 Torr proximate the center of the substrate, a backside pressure of approximately 20-30 Torr proximate the edge of the substrate, and a substrate holder temperature of approximately 25 degrees C.

In 535, the gate structure can be measured. Alternatively, a gate structure measurement may not be required. When the gate structure is measured, iODP techniques can be used.

In 540, the oxide thickness can be measured. Alternatively, an oxide thickness measurement may not be required. When the gate structure is measured, iODP techniques can be used.

In 545, a query can be performed to determine if the current substrate has been processed correctly. When the current substrate has been processed correctly, procedure 500 can branch to 580, and when the current substrate has not been processed correctly, procedure 500 can branch to 550.

In 550, a COR procedure can be performed. Alternatively, a cleaning procedure may be performed.

In 555, a query can be performed to determine when a gate-optimization procedure requires modification. When the gate-optimization procedure requires modification, procedure 500 can branch to 560, and when the gate-optimization procedure does not require modification, procedure 500 can branch to 565.

In 560, a new gate-optimization recipe can be established.

In 565, a query can be performed to determine when a new substrate requires processing. When a new substrate requires processing, procedure 500 can branch to 570C and when a new substrate is not available, procedure 500 can branch to 590. Procedure 500 can end in 590.

In 570, a new substrate can be selected and procedure 500 can branch back to 530. Alternatively, procedure 500 can branch to a different step.

In 580, a query can be performed to determine when additional substrates require processing. When additional substrates require processing, procedure 500 can branch to 510, and when additional substrates are not available, procedure 500 can branch to 590. Procedure 500 can end in 590.

Verification-related sequences can be established for verifying sites used in procedures, substrates, procedures, and/or libraries. Verification-related sequences can include creation procedures, transfer procedures, verification procedures, evaluation procedures, measurement procedures inspection procedures, or any combination thereof. Alternatively, procedures may be included. One or more substrates can be processed using one or more process-related procedures and can be verified using the process-verification processing sequence.

Sites in procedures can be associated with a gate structure in a transistor, a drain structure in a transistor, a source structure in a transistor, a capacitor structure, a via structure, a trench structure, a two-dimensional memory structure, a three-dimensional memory structure, a sidewall angle, a bottom critical dimension (CD), a top CD, a middle CD, an array, a periodic structure, an alignment feature, a doping feature, a strain feature, a damaged-structure, or a reference structure, or any combination thereof.

The gate-optimization processing sequences can include one or more mask creation procedures, one or more deposition procedures, one or more coating procedures, one or more etching procedures, one or more thermal procedures, one or more implanting procedures, one or more doping procedures, one or more exposure procedures, one or more oxidation procedures, one or more nitridation procedures, one or more ionization procedures, one or more development procedures, one or more lithography procedures, one or more scanner-related procedures, one or more measurement procedures, one or more inspection procedures, one or more evaluation procedures, one or more simulation procedures, one or more prediction procedures, one or more rework procedures, one or more storage procedures, one or more transfer procedures, one or more load-lock procedures, or one or more cleaning procedures, or any combination thereof.

Transfer sequences for gate-optimization substrates can be used to determine the transfer system to use, the number of load-locks and/or elements to use, the loading order, the transfer times, and/or the transfer speeds.

In some embodiments, a mask creation procedure can be performed. A verified mask creation procedure can be used to create a verified masking layer having one or more verified gate optimization features and/or structures at one or more sites. When an un-verified mask creation procedure is performed, an un-verified masking layer having one or more unverified gate optimization features and/or structures at one or more sites can be created and the unverified gate optimization substrate can be evaluated and/or verified. Substrate data, processing element and/or processing subsystem data can be obtained and/or stored before, during, and/or after a mask creation procedure is performed.

When multiple sites and/or substrates are evaluated, confidence and/or risk data can be established for individual substrates and/or groups of substrates. Alternatively, other data may be used. For example, confidence data values can range from zero to nine, where zero indicates a failure condition and nine indicates the most accurate performance. In addition, risk data values can range from zero to nine, where zero indicates a failure or high-risk condition and nine indicates the lowest risk condition. Alternatively, other ranges may be used. Ranges can be established for the limits to provide for multi-valued confidence data and/or risk data When a first (most accurate) threshold limit is met, the item being evaluated can be identified as having the highest level of confidence and/or the lowest risk factor associated therewith. When another (less accurate) threshold limit is met, the item being evaluated can be identified as having a lower level of confidence and/or a higher risk factor associated therewith. When one or more (varying in accuracy) threshold limits are not met, the item being evaluated can be identified as an unverified item having a low level of confidence and/or a high risk factor associated therewith.

In some embodiments, a first gate-optimization procedure can be performed. A first set of substrates can be processed by one or more lithography subsystems (170) in the processing system (100), and one or more patterned layers can be created on one or more of the first set of substrates using one or more mask creation procedures. Alternatively, one or more of the mask creation procedures can be performed using one or more of the subsystems (110, 120, 130, and 140) in the processing system (100). Next, first confidence data and/or first risk data can be established for the first set of patterned substrates using a first evaluation procedure, and a first set of high confidence substrates can be established using data from the first evaluation procedure. One or more of the substrates processed by one or more lithography subsystems (170) in the processing system (100) can be transferred to the evaluation subsystem 140, and the one or more patterned layers created on one or more of the first set of substrates using the one or more mask creation procedures can be evaluated. One or more of the substrates can be transferred to the etching subsystem 110, and one or more etched layers can be created on the one or more substrates. For example, a first set of etched substrates can be created by performing one or more etching procedures using the first set of high confidence substrates. Alternatively, the one or more etching procedures may be performed using one or more of the subsystems (110, 120, 130, 140, and 170) in a processing system (100). In addition, second confidence data and/or second risk data can be established for the first set of etched substrates using a second evaluation procedure, and a second set of high confidence substrates can be established using the data from the first and/or second evaluation procedures. The second set of high confidence substrates can be stored and/or sent for further processing. When a second set of low confidence substrates is established, these substrates can be transferred to a COR subsystem 120 where a trimming procedure can be performed. The trimming procedure can be different for each substrate, and a first set of trimmed substrates can be transferred to one or more of the evaluation subsystems 140. Third confidence data and/or third risk data can be established for the first set of trimmed substrates using a third evaluation procedure, and a third set of high confidence substrates can be established using the data from the first, second, and/or third evaluation procedures. The third set of high confidence substrates can be stored and/or sent for further processing.

Figure 6:
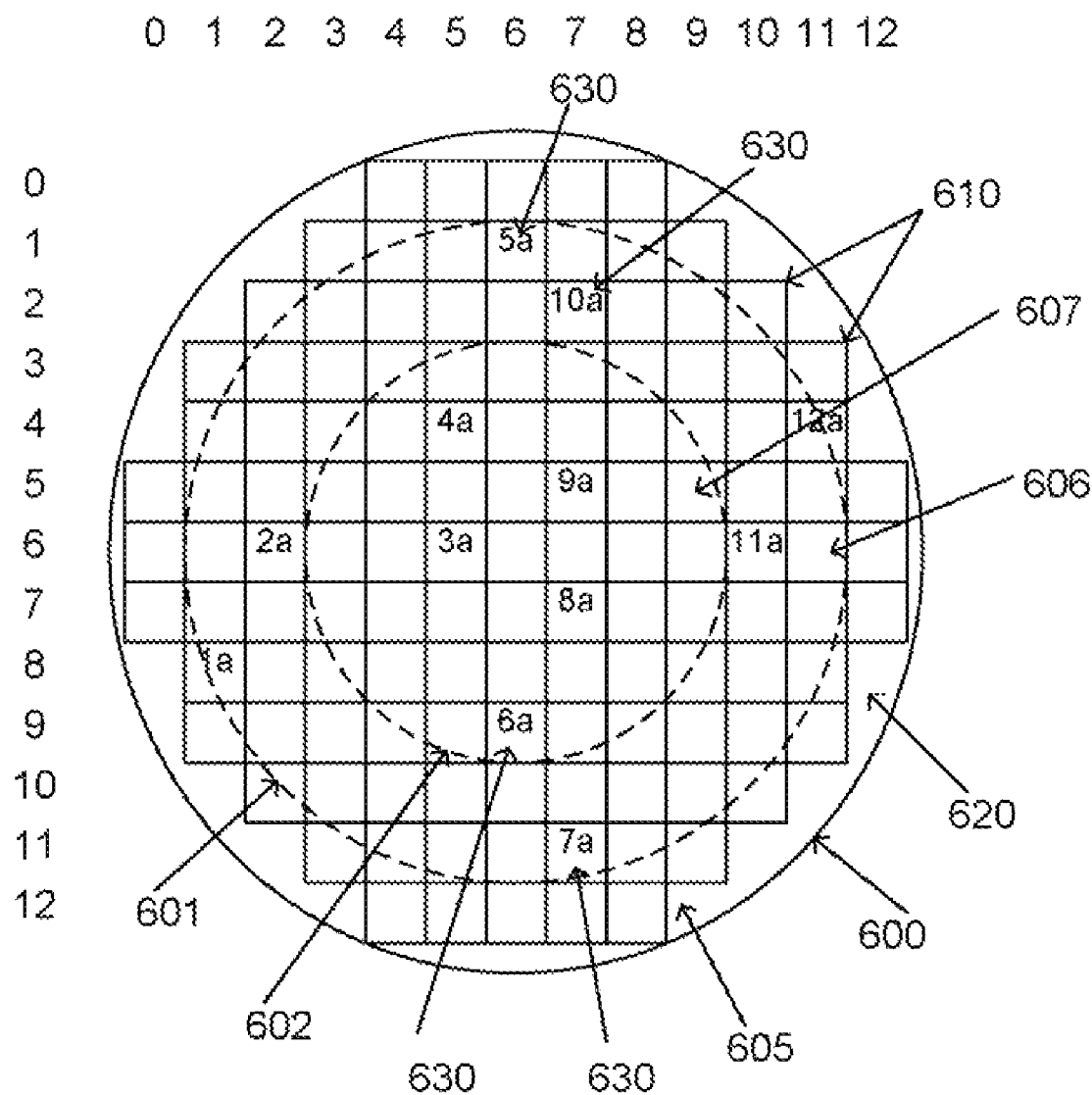
FIG. 6 shows a simplified view of a substrate map in accordance with embodiments of the invention.

FIG. 6 shows a simplified view of a substrate map in accordance with embodiments of the invention. In the illustrated embodiment, a substrate map is shown having one-hundred twenty-five chip/dies, but this is not required for the invention. Alternatively, a different number of chip/dies may be shown. In addition, the circular shapes shown are for illustration purposes and are not required for the invention. For example, the circular substrate may be replaced by a non-circular substrate, and the chip/dies may have non-circular shapes.

The illustrated view shows a substrate map 620 on a substrate 600 that includes one or more chip/dies 610. Rows and columns are shown that are numbered from zero to twelve for illustration. In addition, twelve sites 630 labeled (1*a*-12*a*) can be used to define the location of the sites for the procedures associated with the illustrated substrate map 620. In addition, two circular lines (601 and 602) are shown, and these lines can be used to establish an outer region 605, a mid region 606, and an inner region 607 on the substrate 600. Alternatively, a different number of regions having different shapes may be established on substrate map 620, and a different number of sites for and/or procedures may be established at different locations on the substrate. When a measurement, inspection, and/or evaluation plan is created for a substrate, one or more measurement, inspection, and/or evaluation sites can be established in one or more substrate areas. For example, when the strategy, plan, and/or recipe is created, measurement, inspection, and/or evaluation procedures do not have to include and/or use all of the sites 630 shown in FIG. 6.

The gate optimization procedures can be specified by a semiconductor manufacturer based on data stored in a historical database. For example, a semiconductor manufacturer may have historically chosen a number of positions on the substrate when making SEM measurements and would like to correlate the measurement data, inspection data, and/or evaluation data from one system to the data measured using a SEM system, a TEM system, and/or a FIB system.

In addition the number of measurement or verification sites used in gate optimization procedures can be reduced as the manufacturer becomes more confident that the process is and will continue to produce high quality gate structure and/or devices.

When new and/or additional measurement data, inspection data, and/or evaluation data is required, additional gate optimization data can be obtained from one or more sites on the substrate. For example, measurement features, such as periodic gratings, periodic arrays, and/or other periodic structures, on a substrate can be measured at one or more of the sites shown in FIG. 6.

The gate optimization measurement, inspection, and/or evaluation procedures can be time consuming and can affect the throughput of a processing system. During process runs, a manufacturer may wish to minimize the amount of time used to measure, inspect, verify, and/or evaluate a substrate. The gate optimization procedures can be time-dependent, and different gate optimization procedures may be selected based on their execution time. A smaller number of sites may be used when execution times are too long.

The substrate maps can include one or more Goodness Of Fit (GOF) maps, one or more thickness maps, one or more gate-related maps, one or more Critical Dimension (CD) maps, one or more CD profile maps, one or more material related maps, one or more structure-related maps, one or more sidewall angle maps, one or more differential width maps, or a combination thereof. Some errors that are generated by mapping applications can be sent to the FDC system, and the FDC system can decide how the processing system should respond to the error. Other errors can be resolved by the mapping applications.

Corrective actions ran include calculating new and/or update snaps for the gate-optimization substrates. In addition, corrective actions can include increasing the number of required evaluation sites by one or more when one or more values in the gate-optimization map are not within a limit, and decreasing the number of required evaluation sites by one or more when one or more values in the first gate-optimization map are within the limit.

When substrate maps are created and/or modified, values may not be calculated and/or required for the entire substrate, and a substrate map may include data for one or more sites, one or more chip/dies, one or more different areas, and/or one or more differently shaped areas. For example, a processing chamber may have unique characteristics that may affect the quality of the processing results in certain areas of the substrate. In addition, a manufacturer may allow less accurate process and/or evaluation data for chips/dies in one or more regions of the substrate to maximize yield. When a value in a map is close to a limit, the confidence value may be lower than when the value in a map is not close to a limit. In addition, the accuracy values can be weighted for different chips/dies and/or different areas of the substrate. For example, a higher confidence weight can be assigned to the accuracy calculations and/or accuracy data associated with one or more of the previously used evaluation sites.

In addition, process result, measurement, inspection, verification evaluation, and/or prediction maps associated with one or more processes may be used to calculate a confidence map for a substrate. For example, values from another map may be used as weighting factors.

In some embodiments, a gate optimization sequence can include 1) a first transfer procedure for transferring a first set of substrates to a lithography subsystem 170, 2) a first processing procedure for creating a patterned masking layer using the lithography subsystem, 3) a second transfer procedure for transferring a second set of substrates from the lithography subsystem to one or more evaluation subsystems 140, 4) a first evaluation procedure for evaluating the patterned masking layer using a third set of substrates, 5) a third transfer procedure for transferring a fourth set of substrates from the one or more evaluation subsystems 140 to one or more etching subsystems 110, 6) a second processing procedure for creating one or more etched layers using one or more etching subsystems 110, 7) a fourth transfer procedure for transferring a fifth set of substrates from the one or more etching subsystem 110 to one or more evaluation subsystems 140, 8) a second evaluation procedure for evaluating the etched layers using a sixth set of substrates, 9) a fifth transfer procedure for transferring a seventh set of substrates from the one or more evaluation subsystems 140 to one or more COR subsystems 120, 10) a third processing procedure for trimming one or more etched layers using the COR subsystem, 11) a sixth transfer procedure for transferring a eighth set of substrates from the one or more COR subsystems 120 to one or more evaluation subsystems 140, 12) a third evaluation procedure for evaluating the trimmed layers using a ninth set of substrates, and 13) a seventh transfer procedure for transferring a tenth set of substrates from the one or more evaluation subsystems 140 to one or more storage locations. Alternatively, one or more of the illustrated steps may not be required. When the first, second, and third evaluation procedures are performed, a minimum number of substrates can be evaluated to increase throughput.

The gate-optimization evaluation features can include mask structures, etched structures, trimmed structures, doped structures, filled structures, semi-filled structures, damaged structures, capacitor structures, gate structures, gate electrode structures, gate stack structures, transistor structures, FinFET structures, Complementary Metal-Oxide Semiconductor (CMOS) structures, pFET structures, nFET structures, photoresist structures, periodic structures, alignment structures, trench structures, via structures, array structures, grating structures, or any combination thereof.

In other embodiments, sets of high confidence substrates can be established by: 1a) obtaining mapping data from one or more mask creation evaluation sites during the first mask creation procedures; 2a) comparing the mapping data for each substrate in a first set of substrates to one or more requirements established for the one or more mask creation evaluation sites; and 3a) identifying a substrate in the first set of substrates as a member of a first set of high confidence substrates if a first requirement is met. A second set of high confidence substrates can be established by: 1b) obtaining mapping data from one or more etch-dependent sites during a gate-etch procedure; 2b) comparing the mapping data for each substrate in the first set of high confidence substrates to one or more gate-etch requirements established for the one or more gate-etch-dependent sites; and 3b) identifying a substrate in the first set of high confidence substrates as a member of the second set of high confidence substrates if a first gate-etch requirement is met. A third set of high confidence substrates can be established by: 1c) obtaining mapping data from one or more COR-dependent sites during a COR-etch procedure; 2c) comparing the mapping data for each substrate in the second set of high confidence substrates to one or more COR-etch requirements established for the one or more COR-dependent sites; and 3c) identifying a substrate in the second set of high confidence substrates as a member of the third set of high confidence substrates if a first COR-etch requirement is met.

The gate optimization evaluation sites can include process-dependent sites, measurement-dependent sites, inspection-dependent sites, gate-dependent sites, substrate-dependent sites, or product dependent sites, or any combination thereof. The limit data can include confidence limits, mask creation limits, gate-etch limits, COR-etch limits, accuracy limits, time limits, product requirement limits, measurement limits, inspection limits, simulation limits, prediction limits, or historical limits, or any combination thereof.

In some examples, first confidence and/or risk data can be established for a gate-optimization substrate before, during, and/or after the mask creation procedures are performed by a lithography subsystem 170, second confidence and/or risk data can be established for the gate-optimization substrate before, during, and/or after the mask evaluation procedures are performed by an evaluation subsystem 140, third confidence and/or risk data can be established for the gate-optimization substrate before, during, and/or after one or more etching procedures are performed by an etching subsystem 110, fourth confidence and/or risk data can be established for the gate-optimization substrate before, during, and/or after etch-dependent evaluation procedures are performed by an evaluation subsystem 140, fifth confidence and/or risk data can be established for the gate-optimization substrate before, during, and/or after one or more trimming procedures are performed by an COR subsystem 120, and sixth confidence and/or risk data can be established for the gate-optimization substrate before, during, and/or after one or more COR-dependent evaluation procedures are performed by an evaluation subsystem 140.

In some examples, individual and/or total confidence values for the gate-optimization substrate cans be compared to individual and/or total confidence limits. The processing of a set of gate-optimization substrates can continue, if one or more of the confidence limits are met, or corrective actions can be applied if one or more of the confidence limits are not met. Corrective actions can include establishing confidence values for one or more additional substrates in the set of gate-optimization substrates, comparing the confidence values for one or more of the additional substrates to additional confidence limits, and either continuing to process the set of gate-optimization substrates, if one or more of the additional confidence limits are met, or stopping the processing, if one or more of the additional confidence limits are not met.

In other examples, individual and/or total risk values for the gate-optimization substrate can be compared to individual and/or total risk limits. The processing of a set of gate-optimization substrates can continue, if one or more of the risk limits are met, or corrective actions can be applied if one or more of the risk limits are not met. Corrective actions can include establishing risk values for one or more additional substrates in the set of gate-optimization substrates, comparing the risk values for one or more of the additional substrates to additional risk limits; and either continuing to process the set of gate-optimization substrates, if one or more of the additional risk limits are met, or stopping the processing, if one or more of the additional risk limits are not met.

In other embodiments, a first set of gate-optimization substrates can be received by a first transfer subsystem 150 and transferred to one or more load-lock elements (112, 122, 132, and 142) in a first group of subsystems (110, 120, 130, and 140) that can be coupled to first transfer subsystem 150. Alternatively, one or more of the substrates may be received by one or more other subsystems. One or more gate-optimization sequences can be determined for the gate-optimization substrates. In some cases, different gate-optimization sequences can be determined for some of the gate-optimization substrates. Alternatively, other processing sequences may be established. For example, pre-processing data can include data from a lithography subsystem and/or an evaluation subsystem. One or more of the first set of gate-optimization substrates can be received by one or more load-lock elements 112 in an etching subsystems 110, can be transferred to one or more processing elements 113 in the etching subsystem 110, can be etched using one or more gate-etch procedures, and can be transferred to one or more load-lock elements 112 in the etching subsystem 110. One or more of the etched substrates can be transferred from the etching subsystem 110 to one or more evaluation subsystems 140 using the first transfer subsystem 150. The one or more etched substrates can be received by one or more load-lock elements 142 in an evaluation subsystem 140, can be transferred to one or more evaluation elements 143 in the evaluation subsystem 140, can be evaluated using one or more gate-etch evaluation procedures, and can be transferred to one or more load-lock elements 142 in the evaluation subsystem 140.

In addition, when the one or more gate-etch procedures have produced high quality gate structures, one or more of the substrates can be transferred to other subsystems for post-processing, and when the one or more gate-etch procedures have not produced high quality gate structures, one or more of the substrates can be transferred to one or more COR subsystems 120 for post-processing. One or more of the etched substrates can be transferred from one or more of the etching subsystems 110 or from one or more of the evaluation subsystems 140 to the COR subsystem 120 using the first transfer subsystem 150. The one or more etched substrates can be received by one or more load-lock elements 122 in the COR subsystem 120, can be transferred to one or more processing elements 123 in the COR subsystem 120, can be trimmed using one or more COR procedures, and can be transferred to one or more load-lock elements 142 in the evaluation subsystem 140. One or more of the trimmed substrates can be transferred from the COR subsystem 120 to one or more evaluation subsystems 140 using the first transfer subsystem 150. The one or more trimmed substrates can be received by one or more load-lock elements 142 in an evaluation subsystem 140, can be transferred to one or more evaluation elements 143 in the evaluation subsystem 140, can be evaluated using one or more COR-related evaluation procedures, and can be transferred to one or more load-look elements 142 in the evaluation subsystem 140.

In addition, when the one or more COR procedures have produced high quality gate structures, one or more of the substrates can be transferred to other subsystems for post-processing, and when the one or more COR procedures have not produced high quality gate structures the gate-optimization procedure can be stopped and further evaluation can be performed.

Figure 7:
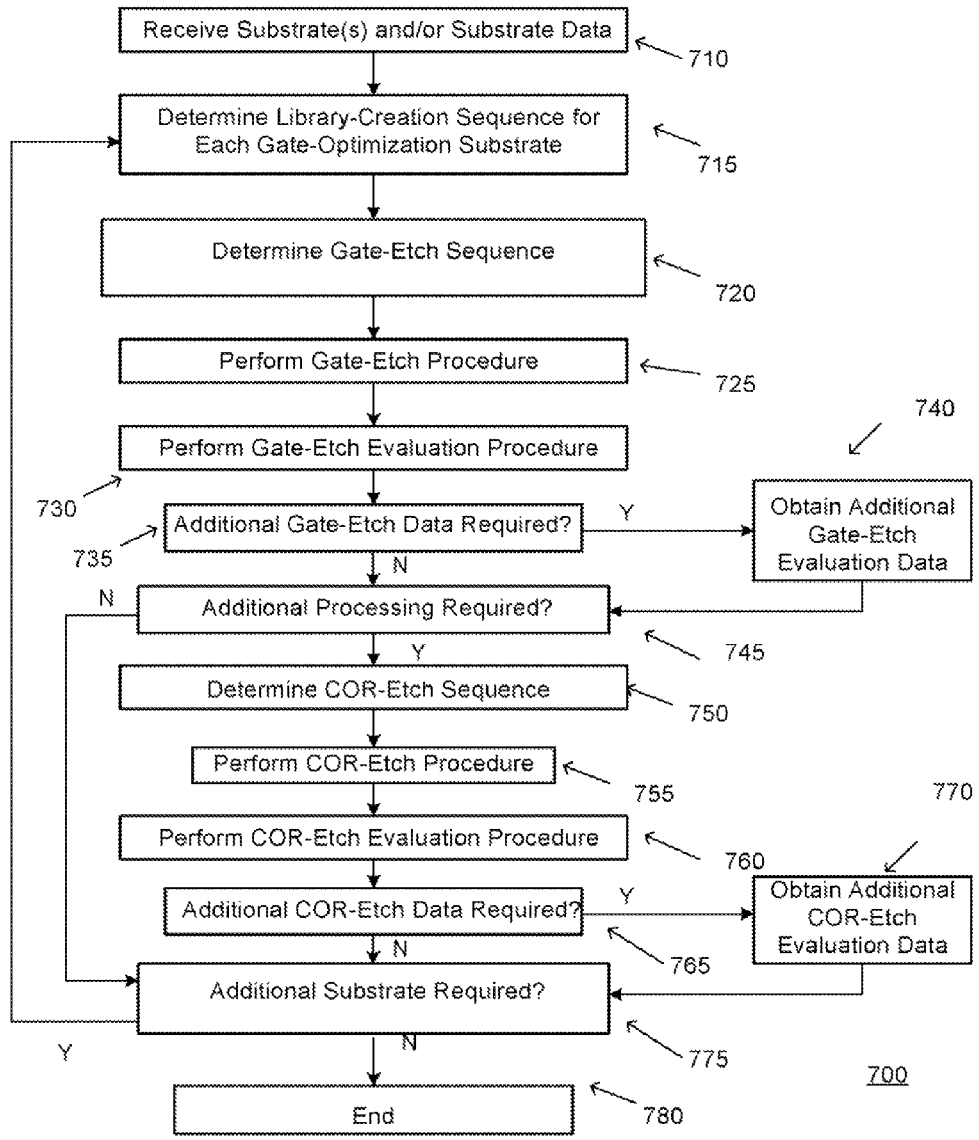
FIG. 7 illustrates an exemplary flow diagram of a method for creating an evaluation library for a gate-optimization procedure in accordance with embodiments of the invention.

FIG. 7 illustrates an exemplary flow diagram of a method for creating an evaluation library for a gate-optimization procedure in accordance with embodiments of the invention.

In 710, a first set of substrates can be received by one or more subsystems in a group of subsystems, and the group of subsystems can be coupled to a first transfer subsystem 150. Each substrate can have substrate data associated therewith, and the substrate data includes historical and/or real-time data. Alternatively, a substrate can be received by a different subsystem. Gate-optimization data can be established for one or more of the substrates, and can include gate-etch data, COR-etch data, and/or evaluation data. In addition, the gate-optimization data can includes a number of required evaluation sites and a number of visited evaluation sites for each substrate.

In 715, a library-creation sequence can be established for creating a library of gate-optimization data, and the library-creation sequence can include one or more transfer procedures, one or more gate-optimization procedures, or one or more evaluation procedures, or any combination thereof.

In 720 a gate-etch procedure and a gate-etch evaluation procedure can be determined using the first library-creation sequence.

In 725, the gate-etch procedure can be performed, and one or more gate-etch reference features can be created at a first number of evaluation sites on each of the gate-etched substrates. Updated data can be created using the gate-etch procedure and can include system data, chamber data, chamber match data, particle data, image data, and/or fault data. For example, when the first number of "to be etched" substrates is less than or equal to the first number of available processing elements 113, the first number of "to be etched" substrates can be transferred to the first number of available processing elements 113 in the one or more etching subsystems 110 using the first transfer subsystem 150. When the first number of "to be etched" substrates is greater than the first number of available processing elements 113, some of the "to be etched" substrates can be stored using one or more of the load-lock elements (112, 122, 132, and 142) and/or the first transfer subsystem 150.

In 730, the gate-etch evaluation procedure can be performed, and a first number of evaluation substrates can be evaluated using the first gate-etch evaluation procedure. The number of required evaluation sites can be established for each evaluation substrate. For example, when the first number of evaluation substrates is less than or equal to the first number of available evaluation elements 143, the first number of evaluation substrates can be transferred to the first number of available evaluation elements 143 in the one or more evaluation subsystems 140 using the first transfer subsystem 150. When the first number of evaluation substrates is greater than the first number of available evaluation elements, some of the evaluation substrates can be stored using one or more of the load-lock elements (112, 122, 132, and 142) and/or the first transfer subsystem 150.

When the gate-etch evaluation procedure is performed, a first site can be selected from the number of required sites on a first evaluation substrate, and the first site can have a first reference feature associated therewith that was created using the gate-etch procedure. First gate-etch evaluation data can be obtained from the first site on the first substrate, and the first evaluation data can include gate-etch-related measurement and/or inspection data. In addition, first predicted data can be established for the first site on the first substrate, and the first predicted data can include predicted measurement and/or inspection data for the gate-etch procedure. Alternatively, simulated data, modeling data, historical data, or real-time data or any combination thereof may be used. Confidence and/or risk data can be established for the first site using differences calculated using the first evaluation data and the first predicted data. When a first gate-etch library creation limit is met, the first site can be identified as a first verified site, the number of remaining evaluation sites can be decreased by one, the number of visited evaluation sites can be increased by one, and the data associated with the first evaluation site can be stored as verified data in a gate-etch evaluation library. When a first gate-etch library creation limit is not met, the first site can be identified as a first unverified site, the number of remaining evaluation sites can be decreased by one, and the number of visited sites can be increased by one. The first verified site can have verified library-related data associated therewith.

In 735, a query can be performed to determine if additional evaluation data is required. When additional evaluation data is required, procedure 700 can branch to step 740, and when additional evaluation data is not required, procedure 700 can branch to step 745.

In 740, additional evaluation data can be obtained when a new site is required for the first substrate, one or more controllers can be configured to perform the following steps; a) selecting a new site from the number of required sites on the first evaluation substrate, where the new site has a new reference feature associated therewith that was created using the gate-etch procedure; b) obtaining new gate-etch evaluation data from the new site on the first substrate, where the new evaluation data includes new gate-etch-related measurement and/or inspection data; c) establishing new predicted data for the new site on the first substrate, wherein the new predicted data comprises new predicted measurement and/or inspection data; d) establishing a new confidence and/or risk data for the new site using a new differences calculated using the new evaluation data and the new predicted data; e) identifying the new site as a new verified site, decreasing the number of required sites by one, increasing the number of visited sites by one, and storing data associated with the new site as verified data in the gate-etch evaluation library, when a first gate-etch library creation limit is met; f) identifying the new site as a new unverified site, decreasing the number of required sites by one, and increasing the number of visited sites by one, when the first gate-etch library creation limit is not met; g) repeating steps a)-f) when the number of required sites is greater than zero; and h) stopping the library creation process when the number of required sites is equal to zero.

When an additional substrate is used, one or more controllers can be configured to perform the following steps: a1) selecting an additional site from the number of required sites on an additional evaluation substrate, where the additional site has an additional reference feature associated therewith that was created using the first gate-etch procedure; b1) obtaining additional gate-etch evaluation data from the additional site on the additional substrate, where the additional gate-etch evaluation data includes additional gate-etch-related measurement and/or inspection data; c1) establishing additional predicted data for the additional site on the additional substrate, where the additional predicted data comprises additional predicted gate-etch-related measurement and/or inspection data for the gate-etch procedure; d1) establishing additional confidence and/or risk data for the additional site using differences calculated using the additional evaluation data and the additional predicted data; e1) identifying the additional site as an additional verified site, decreasing the number of required sites by one, increasing the number of visited sites by one, and storing data associated with the additional site as verified data in the gate-etch evaluation library, when an additional gate-etch library creation limit is met; f1) identifying the additional site as an additional unverified site, decreasing the number of required sites by one, and increasing the number of visited sites by one, when the additional library-related creation limit is not met; g1) repeating steps a1)-f1) when an additional evaluation substrate is available and the number of required sites on the additional evaluation substrate is greater than zero, and h1) stopping the library creation process when an additional evaluation substrate is not available or the number of required sites on the additional evaluation substrate is equal to zero.

In 745, a query can be performed to determine if additional processing is required. When additional processing is required, procedure 700 can branch to step 750, and when additional processing is not required, procedure 700 can branch to step 790.

In 750, a COR-etch procedure and a COR-etch evaluation procedure can be determined using the first library-creation sequence.

In 755, the COR-etch procedure can be performed and one or more COR-etch reference features can be created at a first number of evaluation sites on each of the COR-etched substrates. Updated data can be created using the COR-etch procedure and can include system data, chamber data, chamber match data, particle data, image data, and/or fault data. For example, when the first number of "to be trimmed" substrates is less than or equal to the first number of available processing elements 123, the first number of "to be trimmed" substrates can be transferred to the first number of available processing elements 123 in the one or more COR subsystems 120 using the first transfer subsystem 150. When the first number of "to be trimmed" substrates is greater than the first number of available processing elements 123, a first corrective action can be applied.

In 760, the COR-etch evaluation procedure can be performed, and a first number of evaluation substrates can be evaluated using a first COR-etch evaluation procedure. The number of required evaluation sites can be determined for each evaluation substrate. For example, when the first number of evaluation substrates is less than or equal to the first number of available evaluation elements 143, the first number of evaluation substrates can be transferred to the first number of available evaluation elements 143 in the one or more evaluation subsystems 140 using the first transfer subsystem 150.

When the first number of evaluation substrates is greater than the first number of available evaluation elements, a second corrective action can be applied.

When the COR-etch evaluation procedure is performed, a first site can be selected from the number of required sites on a first evaluation substrate, and the first site can have a first reference feature associated therewith that was created using the COR-etch procedure. First COR-etch evaluation data can be obtained from the first site on the first substrate, and the first evaluation data can include COR-etch-related measurement and/or inspection data. In addition, first predicted data can be established for the first site on the first substrate, and the first predicted data can include predicted measurement and/or inspection data for the COR-etch procedure. Alternatively, simulated data, modeling data, historical data, or real-time data or any combination thereof may be used. Confidence and/or risk data can be established for the first site using differences calculated using the first evaluation data and the first predicted data. When a first COR-etch library creation limit is met, the first site can be identified as a first verified site, the number of remaining evaluation sites can be decreased by one, the number of visited evaluation sites can be increased by one, and the data associated with the first evaluation site can be stored as verified data in a gate-etch evaluation library. When a first COR-etch library creation limit is not met, the first site can be identified as a first unverified site, the number of remaining evaluation sites can be decreased by one, and the number of visited sites can be increased by one. The first verified site can have verified COR-etch library data associated therewith.

In 765, a query can be performed to determine if additional evaluation data is required. When additional evaluation data is required, procedure 700 can branch to step 765, and when additional evaluation data is not required, procedure 700 can branch to step 770.

In 770, additional evaluation data can be obtained. When a new site is required for the first substrate, one or more controllers can be configured to perform the following steps: a2) selecting a new site from the number of required sites on the first evaluation substrate, where the new site has a new reference feature associated therewith that was created using the COR-etch procedure; b2) obtaining new COR-etch evaluation data from the new site on the first substrate, where the new evaluation data includes new COR-etch-related measurement and/or inspection data; c2) establishing new predicted data for the new site on the first substrate, wherein the new predicted data comprises new predicted measurement and/or inspection data for the COR-etch procedure; d2) establishing a new confidence and/or risk data for the new site using a new differences calculated using the new evaluation data and the new predicted data; e2) identifying the new site as a new verified site, decreasing the number of required sites by one, increasing the number of visited sites by one, and storing data associated with the new site as verified data in the gate-etch evaluation library, when a new library-related creation limit is met; f2) identifying the new site as a new unverified site, decreasing the number of required sites by one, and increasing the number of visited sites by one, when the new library-related creation limit is not met; g2) repeating steps a2)-f2) when the number of required sites is greater than zero; and h2) stopping the library creation process when the number of required sites is equal to zero.

When an additional substrate is used, one or more controllers can be configured to perform the following steps: a3) selecting an additional site from the number of required sites on an additional evaluation substrate, where the additional site has an additional reference feature associated therewith that was created using the first COR-etch procedure; b3) obtaining additional COR-etch evaluation data from the additional site on the additional substrate, where the additional COR-etch evaluation data includes additional COR-etch-related measurement and/or inspection data; c3) establishing additional predicted data for the additional site on the additional substrate, where the additional predicted data comprises additional predicted COR-etch-related measurement and/or inspection data for the COR-etch procedure; d3) establishing additional confidence and/or risk data for the additional site using differences calculated using the additional evaluation data and the additional predicted data; e3) identifying the additional site as an additional verified site, decreasing the number of required sites by one, increasing the number of visited sites by one, and storing data associated with the additional site as verified data in the COR-etch evaluation library, when an additional library-related creation limit is met; f3) identifying the additional site as an additional unverified site, decreasing the number of required sites by one, and increasing the number of visited sites by one, when the additional library-related creation limit is not met; g3) repeating steps a3)-f3) when an additional evaluation substrate is available and the number of required sites on the additional evaluation substrate is greater than zero; and h3) stopping the library creation process when an additional evaluation substrate is not available or the number of required sites on the additional evaluation substrate is equal to zero.

In 775, a query can be performed to determine if an additional substrate is required. When an additional substrate is required, procedure 700 can branch to step 715, and when an additional substrate is not required, procedure 700 can branch to step 780. In 780, procedure 700 can end.

In some embodiments, when a substrate is received, the data associated with the substrate and/or lot can be received, and the data can include gate-optimization maps, such as confidence maps, process maps, risk assessment maps, damage-assessment maps, reference maps, measurement maps, prediction maps, imaging maps, library-related maps, and/or other substrate-related maps for the in-coming substrate and/or in-coming lot. The data can include data and/or messages from one or more subsystems associated with the processing system, a host system, and/or another processing system. For example, messages and/or data can be used to determine and/or control the processing sequence and/or the transferring sequences.

The gate-optimization parameters can include real-time information. For example, when a gate-etch procedure is performed, the real-time substrate thickness data and/or real-time substrate temperature data can be used to determine an etching chemistry, or an etching time, a processing gas ratio, an expected endpoint time, heater power, and/or RF power required, and when a COR-etch procedure is performed, the real-time substrate thickness data and/or real-time substrate temperature data can be used to determine an COR chemistry, or a trimming time, a processing gas ratio, an expected endpoint time, heater power, and/or RF power required.

In addition, modeling procedures can create, refine, and/or use a gate-etch model, a COR model, substrate model, an accuracy model, a recipe model, an optical properties model, a structure model, a FDC model, a prediction model, a confidence model, a measurement model, an etching model, a deposition model, a first substrate effect model, a chamber model, a chamber match model, a drift model, a delay time model, an electrical performance model, or a device model, or any combination thereof.

In some embodiments, the gate-optimization data can include thickness data, bottom CD data, middle CD data, top CD data, or angle data, or any combination thereof. In addition, the real-time gate-optimization data can include a calculated thickness, a calculated CD, a calculated depth, and/or a calculated sidewall angle.

In addition, when judgment and/or intervention rules are associated with gate-optimization procedures, they can be executed. Intervention and/or judgment rule evaluation procedures and/or limits can be performed based on historical procedures, on the customer's experience, or process knowledge, or obtained from a host computer. Gate-optimization-based mules can be used in FDC procedures to determine how to respond to alarm conditions, error conditions, fault conditions, and/or warning conditions. The gate-optimization-based FDC procedures can prioritize and/or classify faults, predict system performance, predict preventative maintenance schedules, decrease maintenance downtime, and extend the service life of consumable parts in the system.

The subsystem can take various actions in response to an alarm/fault during a gate-optimization procedure, the actions taken on the alarm/fault can be context-based. Gate-optimization-based context can be specified by a rule, a system/process recipe, a chamber type, identification number, load port number, cassette number, lot number, control job ID, process job ID, slot number and/or the type of data.

As the physical dimensions of the structures decrease, real-time, gate-optimization procedure may be required for a large percentage of the substrates to obtain data that are more accurate. In addition, some substrates may be used to verify a new process and/or to assess an existing process. When a new gate-optimization procedure is being developed and/or verified, the process results can be varying, and an assessment or verification procedure can be performed on a larger percentage of the substrates.

A gate-optimization procedure can be specified by a semiconductor manufacturer based on data stored in a historical database. For example, a semiconductor manufacturer may have historically chosen a number of sites on the substrate when making SEM measurements and would like to correlate the evaluation data to the data measured using a SEM system, TEM system and/or FIB system. In addition, the number of evaluation sites used can be reduced as the manufacturer becomes more confident that the process is and will continue to produce high quality products and/or devices.

Before, during, and/or after a gate-optimization procedure is performed, simulation, modeling and/or prediction data can be created and/or modified. The simulation and/or prediction data can include gate-etch data and/or COR-etch data. The new simulation and/or prediction data can be used in real time to update the calculations, models, and/or gate-optimization procedures. For example, prediction models can include process chemistry models, chamber models, EM models, SPC charts, PLS models, PCA models, FDC models, and Multivariate Analysis (MVA) models.

The historical data can include GOF data, thermal data, thickness data, via-related data. CD data, CD profile data, material related data, trench-related data, sidewall angle data, differential width data, or any combination thereof. The data can also include site result data, site number data, CD measurement flag data, number of measurement sites data, coordinate X data, and coordinate Y data, among others.

Gate-optimization procedures can be used by a subsystems to adjust recipes and/or models in real-time to produce three-dimensional structures, such as single gate and multi-gate transistors. In addition, gate-optimization procedures can be used by subsystems to adjust evaluation, inspection, verification, and/or measurement recipes and/or models in real-time to evaluate, inspect, verify, and/or measure three-dimensional pFET and nFET gate structures. The three-dimensional structures can increase the sensitivity of thickness variations and require structure modeling and/or measurements in multiple directions. Evaluation subsystems can cause throughput problems and higher measurement throughput can be obtained by adjusting the sampling locations, and structures dynamically in procedures. For example, as dimensions get smaller substrate profile data can have a greater impact during aligning, measuring, and/or processing. The substrate profile data can include radius data, curvature data, feature data, and/or thickness data.

In still other embodiments, a substrate can be etched in a first plasma processing chamber in an etching subsystem 110 using a first gate-etch procedure and a patterned masking layer. The etched substrate can be transferred to an evaluation subsystem 140 using an integrated transfer subsystem 150 coupled to the etching subsystem 110 and the evaluation subsystem 140. The etched substrate can be measured and/or inspected, and first real-tire chamber-matching data ran be obtained for the first plasma-processing chamber using one or more evaluation features on the etched substrate. For example, the first real-time chamber-matching data can include critical dimension (CD) data, sidewall angle (SWA) data, structure data, or thickness data, or any combination thereof. In addition, data in a gate-optimization evaluation library can be updated using the first real-time chamber-matching data when the first real-time chamber-matching data is less than or equal to a first library creation limit, and the etched substrate can be post-processed when the first real-time chamber-matching data is greater than the first library creation limit.

FIG. 8 illustrates an exemplary flow diagram of another method for processing substrates using procedures in accordance with embodiments of the invention. The substrates can include one or more layers that can include semiconductor material, carbon material, dielectric material, glass material, ceramic material, metallic material, oxidized material, doped material, implanted material, mask material, or planarization material, or a combination thereof.

In some cases, gate etch procedures can be developed during the early stages of the production cycle and can be used throughout the production cycle, and in other cases, procedures when the more critical processing steps are performed. In some examples, procedures may be used to account for differences between nFET) structures and pFET structures, differences between isolated structures and nested structures, differences between two-dimensional structures and three-dimensional structures, differences between processing chambers, and/or differences between internally-processed substrates and externally processed substrates.

In 810, one or more substrates can be received by one or more subsystems (101, 102, 110, 120, 130, 140, and 150) in a processing system (100). For example, substrates can be received from internal and/or external systems, and the substrates can be received by one or more transfer subsystems (101, 102) coupled to one or more of the subsystems (110, 120, 130, 140, and 150). Alternatively, one or more of the substrates can be received by a different subsystem. In addition, a system controller 190 can be used to receive the substrate data for the one or more substrates. Alternatively, some of the substrate data may be received by a different controller. For example, the substrate data can include historical and/or real-time maps that can include gate-optimization maps, substrate-related maps, process-related maps, damage-assessment maps, reference maps, measurement maps, prediction maps, risk maps, inspection maps, verification maps, evaluation maps, particle maps, and/or confidence map(s) for one or more substrates. In some cases, a MES 180 system can exchange data with the system controller 190 and one or more of the subsystems (110, 120, 130, 140, and 170), and the data can be used to determine and/or control the gate-optimization procedure. A processing sequence can be determined for each substrate, and one or more substrates can be processed at substantially the same time using different processing elements (chambers). For example, processing sequences can be used to determine which subsystem is used. In other examples, processing can be performed by the first available processing element.

In 815, a query can be performed to determine if one or more or the substrates requires additional processing. When additional processing is required, procedure 800 can branch to 820, and when additional processing is not required, procedure 800 can branch to 825.

In 820, one or more additional procedures can be performed. The additional processing can be performed using one or more of the subsystems (110, 120, 130, 140, and 170). Alternatively, other subsystems (not shown) may be used. The additional processing can include implanting procedures, doping procedures, thermal procedures, masking procedures, and/or measurement procedures. For example, a patterned masking layer can be created on one or more substrates, and the lithography subsystem 170 can be used to create the patterned masking layer.

In 825, a query can be performed to determine if one or more of the substrates require evaluation. When an evaluation procedure is required, procedure 800 can branch to 830, and when an evaluation procedure is not required, procedure 800 can branch to 835.

In 830, one or more evaluation procedures can be performed. When all evaluation procedure is performed, measurement data can be obtained using one or more sites on one or more of the substrates. In addition, evaluation and/or inspection data can be obtained using an evaluation procedure and/or an inspection procedure. In some cases, a single evaluation substrate can be selected and the selected substrate can have an evaluation procedure associated with it. In other cases, additional substrates and different evaluation procedures can be used. For example, evaluation decisions for one or more sets of substrates can be made using confidence and/or risk data from one or more substrates.

In some embodiments, an evaluation feature associated with a gate structure can be measured using iODP techniques. Alternatively, a periodic pattern of gate structures may be used. In addition, the oxide thickness can be measured. Alternatively, an oxide thickness measurement may not be required.

In 835, a gate etch procedure can be performed. For example, a first gate recipe can be performed in an SCCM Poly chamber and the processing conditions can include a chamber pressure of approximately 40 mTorr, a top electrode RF power level of approximately 240-260 watts, a bottom electrode RF power level of approximately 190-210 watts, a flow rate for a first process gas ($CHF_3$) of approximately 20-30 sccm, a flow rate for a second process gas (Ar) of approximately 450-500 sccm, a backside pressure of approximately 8-12 Torr proximate the center of the substrate, a backside pressure of approximately 20-30 Torr proximate the edge of the substrate, and a substrate holder temperature of approximately 25 degrees C.

In 840, a query can be performed to determine if the current substrate has been processed correctly. When the current substrate has been processed correctly, procedure 800 can branch to 860, and when the current substrate has not been processed correctly, procedure 800 can branch to 845.

In 845, a COR procedure can be performed. Alternatively, a cleaning procedure may be performed.

In 850, a query can be performed to determine if a processing change is required for the current substrate. When a processing change is required for the current substrate, procedure 300 can branch to 850, and when a processing change is not required for the current substrate, procedure 800 can branch to 860.

In 855, one or more gate-etch procedures and/or one or more COR-etch procedures can be changed and/or new procedures can be created.

In 860, a query can be performed to determine if additional processing is required for the current substrate(s). When one or more substrates require additional processing, procedure 300 can branch back to 820, and when additional processing is not required for the current, procedure 800 can branch to 865.

In 865, a query can be performed to determine when additional substrates require processing. When additional substrates require processing, procedure 800 can branch to 810, and when additional substrates are not available, procedure 800 can branch to 870. Procedure 800 can end in 870.

The exemplary gate stack for an nFET before a gate-etch process is performed can include a bulk silicon layer, a buried oxide layer, a silicon-on-insulator (SOI) layer, a gate oxide layer, an undoped poly-Si layer, a doped poly-SI layer; a nitride cap layer, an oxide layer, and a bottom antireflective coating (BARC) layer. Alternatively, other materials can be shown. In some embodiments, pre-processing data can be established for a gate-optimization procedure, and the exemplary gate stack can be measured before an "over-etch" process is performed. In other embodiments, pre-processing data can be established for a gate-optimization procedure using one or more patterned masking layers, and the one or more patterned masking layers can be measured before a gate-etch process is performed.

An exemplary gate stack for an nFET after a gate-etch process is performed can include a bulk silicon layer, a buried oxide layer, a silicon-on-insulator (SOI) layer, a damaged gate oxide layer, an undoped poly-Si layer, a doped poly-SI layer, a nitride cap layer, an oxide layer, and a bottom antireflective coating (BARC) layer. For example, the damaged gate oxide layer can be characterized by an increase in thickness, and the thickness increase can vary from approximately 2 nm to approximately 6 nm. Alternatively, other materials can be shown. In some embodiments, post-processing data can be established for a gate-optimization procedure, and the exemplary gate stack can be measured after an "over-etch" process is performed. In other embodiments, post-processing data can be established for a gate-optimization procedure after one or more COR-etch procedures, and the one or more trimmed (COR'ed) structures can be measured after a COR-etch process is performed. When a COR-etch procedure is performed, process residues can be removed, gate oxide material can be removed, and damaged gate oxide material can be removed.

The structure for a pFET can be substantially the same except a doped poly-Si layer may not be required. The dimensions shown are for a 45 nm gate structure, and the dimensions can be scaled for 32 nm gate structures.

The pre-processing data and post-processing data can be stored in gate-optimization libraries and/or databases. In some embodiments, the pre-processing data and/or post-processing data can include process parameter data. In addition, the pre-processing data can be fed forward, and the post-processing data can be fed back. When iODP measurements are made, bottom CD data, top CD data, and SWA data can be obtained. In some examples, oxide thickness can be measured between line in a grating, and the grating range can be 250-315 nm. In other examples, oxide thickness can be measured using a pad feature that is adjacent a structure, and the pad feature can be approximately 50×50 micrometers.

In some embodiments, over-etch (OE) plasma processing data can be fed forward to an IM procedures, and the OE data can be used to identify a data space in a gate-optimization library. For example, substrate thickness and/or substrate temperature data can be fed forward. In addition, critical dimension (CD) data and sidewall angle (SWA) data can be used to optimize the gate-etch process, and the CD data and SWA data can be obtained from a grating structure.

In other embodiments, gate-etch processing data can be fed forward to one or more IM procedures, and the gate-etch data can be used to identify a data space in a gate-optimization library. For example, substrate thickness and/or substrate temperature data can be fed forward. In addition, a first IM procedure can be used to measure a first target that can be a gate grating, and a second IM procedure can be used to measure a gate pad. The CD data and SWA data from the first IM procedure and the thickness data from the second IM procedure can be used to optimize the gate-etch process, and the CD data and SWA data can be obtained from a grating structure. Note: this is not to constrain the gate oxide thickness in the ODP model, but to actually measure the surface thickness between gates. In some examples, separate feedback control loops can be configured.

In still other embodiments, a first IM process, a gate-etch process, a second IM process, a COR trim process, and a third IM can be performed. Alternatively, one or more of the IM processes may not be required. In addition, pre-processing data can be established for a gate-optimization procedure, and an exemplary gate stack can be measured using a first IM procedure before a gate-etch process is performed. In some examples, pre-processing data can be established for a gate-optimization procedure using one or more patterned masking layers, and the one or more patterned masking layers can be measured using the first IM procedure. In other examples, pre-processing data can be established for a gate-optimization procedure using one or more etched layers, and the one or more etched layers can be measured before an "over-etch" procedure is performed using the first IM procedure. The data from the first IM procedure can be used to optimize the gate-etch process, the COR trim process, second IM procedure, or the third IM procedure, or any combination thereof, and the data can include CD data, SWA data, or thickness data, or any combination thereof. The data from the second IM procedure can be used to optimize the gate-etch process, the COR trim process, first IM procedure, or the third IM procedure, or any combination thereof, and the data can include CD data, SWA data, or thickness data, or any combination thereof. The data from the third IM procedure can be used to optimize the gate-etch process, the COR trim process, the first IM procedure, or the second IM procedure, or any combination thereof and the data can include CD data, SWA data, or thickness data, or any combination thereof.

In some embodiments, over-etch (OE) plasma processing data can be fed forward to an IM procedures, and the OE data can be used to identify a data space in a gate-optimization library. For example, substrate thickness and/or substrate temperature data can be fed forward. In addition, critical dimension (CD) data and sidewall angle (SWA) data can be used to optimize the gate-etch process, and the CD data and SWA data can be obtained from a grating structure.

In some examples, the gate oxide "swelling" can be minimized by controlling the over-etch recipe. IM procedures can be used to measure and feedback the gate oxide swelling thickness data. In addition, IM procedures can be used to monitor the uniformity of the substrate. IM procedures can use one or more pads and one or more gratings. For example, the data from the grating can be used to measure the gate CD, sidewall angle, and the spacer CD, while the pad can be used to measure the gate oxide swelling. The calculation of gate oxide thickness can be achieved by using an integrated Scatterometry (SE or RP), or using and X-Ray Fluorescence (XRF) (both referred to as IM)

In some embodiments, an XRF standalone system could be used as a reference system and for the calibration of the oxide film thickness measurements made by scatterometry.

In other embodiments, a gate etch (first spacer) procedure can be followed by a COR procedure to clean the surface after etch, and removing the oxide and the swelled oxide, A COR procedure provides less recess etching than a wet clean procedure. One or more Tactras™ Systems from Tokyo Electron Limited can be used to perform the etching, IM, and COR procedures.

During the formation of the gate transistor, the gate stack can be etched using a poly etch selective process that is non-selective to the gate oxide. At the end of this step, the gate oxide film at the edge of the gate (over the source and the drain) can be exposed to plasma. The plasma-exposed area creates a local electric field causing the negatively charged O ion to diffuse into the SOI, effectively swelling the oxide film next to the gate channel. The swelling of the gate oxide reduces the thickness of the SOI layer, thus, effectively lowering the channel area, changing the electromagnetic field, and changing the switching speed.

In some embodiments, one or more etch steps can be used to control this swelling. For example, a controllable over-etch procedure and one or more measurement procedures can be used to control the thickness of this oxide swelling. In one measurement method, the thin gate oxide can be accurately measured by making a pre-measurement of a pad area, calculating the combined buried oxide and gate oxide thickness, and then calculating the difference. By controlling a difference instead of an absolute thickness, this method compensates for variation in the buried oxide that is not controlled as accurately as the gate oxide. A second measurement method would be to use and XTRF measurement. In some examples, the exposed oxide can be removed using a COR process and the substrate can be transferred under vacuum to another IM element, and the same measurement features can be used to verify the COR procedure. Measuring the gate grating can give the spacer sidewall thickness. By integrating the COR and IM steps, the opportunity for native oxide growth is eliminated.

In some fabrication environments, gate-optimization procedures can provide data that was previously unavailable, can provide faster processing, can provide faster devices, can replace destructive methods, can provide higher confidence substrates, can improve uniformity, can reduce the number of substrates at risk, and can provide shorter reaction times to process and/or system excursions.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

Thus, the description is not intended to limit the invention and the configuration, operation, and behavior of the present invention has been described with the understanding that modifications and variations of the embodiments are possible, given the level of detail present herein. Accordingly, the preceding detailed description is not mean or intended to, in any way, limit the invention—rather the scope of the invention is defined by the appended claims.

What is claimed:

1. A method of creating a gate-optimization evaluation library comprising:

receiving a plurality of gate-optimization wafers by a first transfer subsystem in a processing system, the first transfer subsystem being coupled to a first group of subsystems, each gate-optimization wafer having wafer data associated therewith, wherein the wafer data includes historical and/or real-time data;

establishing a library-creation sequence for each gate-optimization wafer, the library-creation sequence being used to create a library of gate-optimization evaluation data, the library-creation sequence being created using the wafer data, wherein the library-creation sequence comprises a gate-etch procedure, a chemical oxide removal (COR)-etch procedure, or a gate-optimization evaluation procedure, or any combination thereof;

performing a first gate-etch procedure using one or more of the gate-optimization wafers, wherein one or more gate-etched wafers are created by the first gate-etch procedure and one or more gate-etch features are created at a first number of evaluation sites on each of the gate-etched wafers;

performing a first gate-etch evaluation procedure using a first gate-etch evaluation wafer, wherein first gate-etch risk data is established for the first gate-etch evaluation wafer by using gate-etch data from a gate-optimization evaluation library;

identifying the first gate-etch evaluation wafer as a verified gate-etch wafer when the first gate-etch risk data is less than or equal to a first gate-etch risk limit; and obtaining additional evaluation data and identifying the first gate-etch evaluation wafer as an unverified gate-etch wafer when the first gate-etch risk data is greater than the first gate-etch risk limit, wherein the identifying the first gate-etch evaluation wafer as a verified gate-etch wafer further comprises:

selecting a first site from the first number of evaluation sites on the first gate-etch evaluation wafer, wherein the first site has a first gate-etch feature associated therewith that was created using the first gate-etch procedure;

obtaining first gate-etch evaluation data from the first site on the first gate-etch evaluation wafer wherein the first site has first gate-etch measurement data associated therewith;

establishing first predicted gate-etch data for the first site on the first gate-etch evaluation wafer, wherein the first predicted gate-etch data comprises predicted gate-etch measurement data;

establishing first gate-etch confidence data using a first difference calculated using the first gate-etch evaluation data and the first predicted gate-etch data; and establishing the first gate-etch risk data for the first gate-etch evaluation wafer using the gate-etch confidence data, the first difference, or the wafer data, or any combination thereof.

2. The method of claim 1, wherein the obtaining additional evaluation data further comprises:

a) selecting a new site from a number of required sites on the first gate-etch evaluation wafer, wherein the new site has a new gate-etch feature associated therewith that was created using the first gate-etch procedure;

b) obtaining new gate-etch evaluation data from the new site on the first gate-etch evaluation wafer, wherein the new site has new gate-etch measurement data associated therewith;

c) establishing new predicted gate-etch data for the new site on the first gate-etch evaluation wafer, wherein the new predicted gate-etch data comprises new predicted gate-etch measurement data;

d) establishing new gate-etch confidence data for the new site using a new difference calculated using the new gate-etch evaluation data and the new predicted gate-etch data;

e) establishing new gate-etch risk data for the first gate-etch evaluation wafer using the new gate-etch confidence data, the new difference, the first gate-etch confidence data, the first difference, or the wafer data, or any combination thereof;

f) identifying the new site as an additional verified site having the new gate-etch confidence data associated therewith, decreasing the number of required sites by one, and storing data associated with the new site as verified data in the gate-optimization evaluation library, when the new gate-etch confidence data is greater than or equal to a new gate-etch confidence limit;

g) identifying the new site as an additional unverified sites and decreasing the number of required sites by one, when the new gate-etch confidence data is less than the new gate-etch confidence limit;

h) identifying the first gate-etch evaluation wafer as a verified gate-etch evaluation wafer having the new gate-etch risk data associated therewith, and storing data associated with the first gate-etch evaluation wafer as verified data in the gate-optimization evaluation library, when the new gate-etch risk data is less than or equal to a new gate-etch risk limit;

i) identifying the first gate-etch evaluation wafer as an new unverified wafer, when the new gate-etch risk data is greater than the new gate-etch risk limit;

j) repeating steps a)-i) when the number of required sites is greater than zero; and k) stopping a gate-optimization evaluation library creation process when the number of required sites is equal to zero.

3. The method of claim 2, further comprising:

a1) selecting an additional site from the number of required sites on an additional gate-etch evaluation wafer wherein the additional site has an additional gate-etch feature associated therewith that was created using the first gate-etch procedure;

b1) obtaining additional gate-etch evaluation data from the additional site on the additional gate-etch evaluation wafer, wherein the additional site has additional gate-etch measurement data associated therewith;

c1) establishing additional predicted gate-etch data for the additional site on the additional gate-etch evaluation wafer, wherein the additional predicted gate-etch data comprises additional predicted gate-etch measurement data;

d1) establishing additional gate-etch confidence data for the additional site using an additional difference calculated using the additional gate-etch evaluation data and the additional predicted gate-etch data;

e1) establishing additional gate-etch risk data for the additional gate-etch evaluation wafer using the additional gate-etch confidence data, the additional difference, the new gate-etch confidence data, the new difference, the first gate-etch confidence data, the first difference, or the wafer data, or any combination thereof;

f1) identifying the additional site as an additional verified site having the additional gate-etch confidence data associated therewith, decreasing the number of required sites by one, and storing data associated with the additional site as verified data in the gate-optimization evaluation library, when the additional gate-etch confidence data is greater than or equal to an additional gate-etch confidence limit;

g1) identifying the additional site as an additional unverified site, and decreasing the number of required sites by one, when the additional gate-etch confidence data is less than the additional gate-etch confidence limit;

h1) identifying the additional gate-etch evaluation wafer as an additional verified gate-etch evaluation wafer having the additional gate-etch risk data associated therewith, and storing data associated with the additional gate-etch evaluation wafer as verified data in the gate-optimization evaluation library, when the additional gate-etch risk data is less than or equal to an additional gate-etch risk limit;

i1) identifying the additional gate-etch evaluation wafer as an additional unverified wafer, when the additional gate-etch risk data is greater than the additional gate-etch risk limit;

j1) repeating steps a1)-i1) when an additional gate-etch evaluation wafer is available and the number of required sites on the additional gate-etch evaluation wafer is greater than zero; and k1) stopping the gate-optimization library creation process when the additional gate-etch evaluation wafer is not available or the number of required sites on the additional gate-etch evaluation wafer is equal to zero.

4. The method of claim 1, further comprising:

performing a first chemical oxide removal (COR)-etch procedure using one or more of the gate-optimization wafers, wherein one or more chemical oxide removal (COR)-etched wafers are created by the first chemical oxide removal (COR)-etch procedure and one or more chemical oxide removal (COR)-etch features are created at a first number of evaluation sites on each of the gate-etched wafers;

performing a first gate-etch evaluation procedure using a first gate-etch evaluation wafer, wherein first gate-etch risk data is established for the first gate-etch evaluation wafer by using gate-etch data from a gate-optimization evaluation library;

performing a first chemical oxide removal (COR)-etch procedure using one or more of the gate-optimization wafers, wherein a first number of chemical oxide removal (COR)-etched wafers are created by the first chemical oxide removal (COR)-etch procedure;

performing a first chemical oxide removal (COR)-etch evaluation procedure using a first chemical oxide removal (COR)-etch evaluation wafer, wherein chemical oxide removal (COR)-etch confidence data and chemical oxide removal (COR)-etch risk data is established for the first chemical oxide removal (COR)-etch evaluation wafer by using gate-etch data from a gate-optimization evaluation library;

identifying the first chemical oxide removal (COR)-etch evaluation wafer as a verified chemical oxide removal (COR)-etch wafer when the first chemical oxide removal (COR)-etch risk data is less than or equal to a first chemical oxide removal (COR)-etch risk limit; and obtaining additional evaluation data and identifying the first chemical oxide removal (COR)-etch evaluation wafer as an unverified chemical oxide removal (COR)-etch wafer when the first chemical oxide removal (COR)-etch risk data is greater than the first chemical oxide removal (COR)-etch risk limit.

5. The method of claim 4, wherein the identifying the first chemical oxide removal (COR)-etch evaluation wafer as a verified chemical oxide removal (COR)-etch wafer further comprises:

selecting a first site from the first number of evaluation sites on the first chemical oxide removal (COR)-etch evaluation wafer wherein the first site has a first chemical oxide removal (COR)-etch feature associated therewith that was created using the first chemical oxide removal (COR)-etch procedure;

obtaining first chemical oxide removal (COR)-etch evaluation data from the first site on the first chemical oxide removal (COR)-etch evaluation wafer, wherein the first site has first chemical oxide removal (COR)-etch measurement data associated therewith;

establishing first predicted chemical oxide removal (COR)-etch data for the first site on the first chemical oxide removal (COR)-etch evaluation wafer, wherein the first predicted chemical oxide removal (COR)-etch data comprises predicted chemical oxide removal (COR)-etch measurement data;

establishing first chemical oxide removal (COR)-etch confidence data using a first difference calculated using the first chemical oxide removal (COR)-etch evaluation data and the first predicted chemical oxide removal COR)-etch data; and establishing the first chemical oxide removal (COR)-etch risk data for the first chemical oxide removal (COR)-etch evaluation wafer using the chemical oxide removal (COR)-etch confidence data, the first difference, or the wafer data, or any combination thereof.

6. The method of claim 5, wherein the obtaining additional evaluation data further comprises:

a2) selecting a new site from a number of required sites on the first chemical oxide removal (COR)-etch evaluation wafer, wherein the new site has a new chemical oxide removal (COR)-etch feature associated therewith that was created using the first chemical oxide removal (COR)-etch procedure;

b2) obtaining new chemical oxide removal (COR)-etch evaluation data from the new site on the first chemical oxide removal (COR)-etch evaluation wafer, wherein the new site has new chemical oxide removal (COR)-etch measurement data associated therewith;

c2) establishing new predicted chemical oxide removal (COR)-etch data for the new site on the first chemical oxide removal (COR)-etch evaluation wafer, wherein the new predicted chemical oxide removal (COR)-etch data comprises new predicted chemical oxide removal (COR)-etch measurement data;

d2) establishing new chemical oxide removal (COR)-etch confidence data for the new site using a new difference calculated using the new chemical oxide removal (COR)-etch evaluation data and the new predicted chemical oxide removal (COR)-etch data;

e2) establishing new chemical oxide removal (COR)-etch risk data for the first chemical oxide removal (COR)-etch evaluation wafer using the new chemical oxide removal (COR)-etch confidence data, the new difference, the first chemical oxide removal (COR)-etch confidence data, the first difference, or the wafer data, or any combination thereof;

f2) identifying the new site as an additional verified site having the new chemical oxide removal (COR)-etch confidence data associated therewith, decreasing the number of required sites by one, and storing data associated with the new site as verified data in the gate-optimization evaluation library, when the new chemical oxide removal (COR)-etch confidence data is greater than or equal to a new chemical oxide removal (COR)-etch confidence limit;

g2) identifying the new site as an additional unverified site, and decreasing the number of required sites by one, when the new chemical oxide removal (COR)-etch confidence data is less than the new chemical oxide removal (COR)-etch confidence limit;

h2) identifying the first chemical oxide removal (COR)-etch evaluation wafer as a verified chemical oxide removal (COR)-etch evaluation wafer having the new chemical oxide removal (COR)-etch risk data associated therewith, and storing data associated with the first chemical oxide removal (COR)-etch evaluation wafer as verified data in the gate-optimization evaluation library, when the new chemical oxide removal (COR)-etch risk data is less than or equal to a new chemical oxide removal (COR)-etch risk limit;

i2) identifying the first chemical oxide removal (COR)-etch evaluation wafer as an new unverified wafer, when the new chemical oxide removal (COR)-etch risk data is greater than the new chemical oxide removal (COR)-etch risk limit;

j2) repeating steps a2)-i2) when the number of required sites is greater than zero; and k2) stopping the gate-optimization evaluation library creation process when the number of required sites is equal to zero.

7. The method of claim 6, further comprising:

a3) selecting an additional site from the number of required sites on an additional chemical oxide removal (COR)-etch evaluation wafer, wherein the additional site has an additional chemical oxide removal (COR)-etch feature associated therewith that was created using the first chemical oxide removal (COR)-etch procedure;

b3) obtaining additional chemical oxide removal (COR)-etch evaluation data from the additional site on the additional chemical oxide removal (COR)-etch evaluation wafer, wherein the additional site has additional chemical oxide removal (COR)-etch measurement data associated therewith;

c3) establishing additional predicted chemical oxide removal (COR)-etch data for the additional site on the additional chemical oxide removal (COR)-etch evaluation wafer, wherein the additional predicted chemical oxide removal (COR)-etch data comprises additional predicted chemical oxide removal (COR)-etch measurement data;

d3) establishing additional chemical oxide removal (COR)-etch confidence data for the additional site using an additional difference calculated using the additional chemical oxide removal (COR)-etch evaluation data and the additional predicted chemical oxide removal (COR)-etch data;

e3) establishing additional chemical oxide removal (COR)-etch risk data for the additional chemical oxide removal (COR)-etch evaluation wafer using the additional chemical oxide removal (COR)-etch confidence data, the additional difference, the new chemical oxide removal (COR)-etch confidence data, the new difference, the first chemical oxide removal (COR)-etch confidence data, the first difference, or the wafer data, or any combination thereof;

f3) identifying the additional site as an additional verified site having the additional chemical oxide removal (COR)-etch confidence data associated therewith, decreasing the number of required sites by one, and storing data associated with the additional site as verified data in the gate-optimization evaluation library, when the additional chemical oxide removal (COR)-etch confidence data is greater than or equal to an additional chemical oxide removal (COR)-etch confidence limit;

g3) identifying the additional site as an additional unverified site, and decreasing the number of required sites by one, when the additional chemical oxide removal (COR)-etch confidence data is less than the additional chemical oxide removal (COR)-etch confidence limit;

h3) identifying the additional chemical oxide removal (COR)-etch evaluation wafer as an additional verified chemical oxide removal (COR)-etch evaluation wafer having the additional chemical oxide removal (COR)-etch risk data associated therewith, and storing data associated with the additional chemical oxide removal (COR)-etch evaluation wafer as verified data in the gate-optimization evaluation library, when the additional chemical oxide removal (COR)-etch risk data is less than or equal to an additional chemical oxide removal (COR)-etch risk limit;

i3) identifying the additional chemical oxide removal (COR)-etch evaluation wafer as an additional unverified wafer, when the additional chemical oxide removal (COR)-etch risk data is greater than the additional chemical oxide removal (COR)-etch risk limit;

j3) repeating steps a3)-i3) when an additional chemical oxide removal (COR)-etch evaluation wafer is available and the number of required sites on the additional chemical oxide removal (COR)-etch evaluation wafer is greater than zero; and k3) stopping the gate-optimization library creation process when the additional chemical oxide removal (COR)-etch evaluation wafer is not available or the number of required sites on the additional chemical oxide removal (COR)-etch evaluation wafer is equal to zero.

8. The method of claim 1, wherein the one or more gate-etch features comprise a bulk silicon layer, a buried oxide layer, a silicon-on-insulator (SOI) layer, a gate oxide layer, an undoped poly-Si layer, a doped poly-SI layer, a nitride cap layer, an oxide layer, or a bottom antireflective coating (BARC) layer, or any combination thereof.

9. The method of claim 8, wherein the gate oxide layer comprises damaged material.

10. The method of claim 1, wherein the one or more gate-etch features comprises spaces in a periodic structure, lines in a periodic structure, or test pads in a scribe line, or any combination thereof.

11. The method of claim 1, further comprising:

calculating a first confidence map for a first gate-optimization wafer, the first confidence map including confidence data for a first set of sites on the first gate-optimization wafer; and establishing the library-creation sequence using a first updated gate-optimization sequence, wherein the first updated gate-optimization sequence comprises one or more additional sites when one or more values in the first confidence map are not within a first confidence limit, wherein a number of evaluation sites is increased by establishing one or more new evaluation sites for the first gate-optimization wafer, and wherein the first updated gate-optimization sequence comprises one or more fewer sites when one or more values in the first confidence map are within the first confidence limit, wherein the number of evaluation sites is decreased by establishing one or more fewer evaluation sites for the first gate-optimization wafer.

12. The method of claim 1, wherein the gate-optimization evaluation library comprises at least one of goodness of fit data, creation rules data, measurement data, inspection data, verification data, mapping data, confidence data, risk data, intensity data, transmission data, absorption data, reflectance data, diffraction data, accuracy data, process data, or uniformity data, or any combination thereof.

13. The method of claim 1, wherein gate-optimization evaluation library is verified using CD-scanning electron microscope (CD-SEM) data, transmission electron microscope (TEM) data, and/or focused ion beam (FIB) data.

14. The method of claim 1, wherein the processing system comprises at least one of one or more lithography subsystems, one or more scanner subsystems, one or more inspection subsystems, one or more measurement subsystems, one or more evaluation subsystems, one or more etching subsystems, one or more deposition subsystems, one or more thermal processing subsystems, one or more coating subsystems, one or more alignment subsystems, one or more polishing subsystems, one or more storage subsystems, one or more transfer subsystems, one or more cleaning subsystems, one or more rework subsystems, one or more oxidation subsystems, one or more nitridation subsystems, or one or more external subsystems, or any combination thereof.

15. The method of claim 1, wherein the library-creation sequence comprises at least one of one or more lithography-related procedures, one or more scanner-related procedures, one or more inspection-related procedures, one or more measurement-related procedures, one or more evaluation-related procedures, one or more etch-related procedures, one or more deposition-related procedures, one or more thermal processing procedures, one or more coating-related procedures, one or more alignment-related procedures, one or more polishing-related procedures, one or more storage-related procedures, one or more transfer procedures, one or more cleaning-related procedures, one or more rework-related procedures, one or more oxidation-related procedures, one or more nitridation-related procedures, or one or more external procedures, or any combination thereof.

* * * * *